US012464850B2

(12) United States Patent
Yang et al.

(10) Patent No.: US 12,464,850 B2
(45) Date of Patent: Nov. 4, 2025

(54) SOLAR CELL, METHOD FOR MANUFACTURING THE SAME, PHOTOVOLTAIC MODULE AND PHOTOVOLTAIC SYSTEM

(71) Applicant: TRINA SOLAR CO., LTD., Changzhou (CN)

(72) Inventors: Guangtao Yang, Changzhou (CN); Yifeng Chen, Changzhou (CN); Daming Chen, Changzhou (CN); Yunyun Hu, Changzhou (CN)

(73) Assignee: TRINA SOLAR CO., LTD., Changzhou (CN)

( * ) Notice: Subject to any disclaimer, the term of this patent is extended or adjusted under 35 U.S.C. 154(b) by 0 days.

(21) Appl. No.: 18/867,574

(22) PCT Filed: May 31, 2024

(86) PCT No.: PCT/CN2024/096597
§ 371 (c)(1),
(2) Date: Nov. 20, 2024

(87) PCT Pub. No.: WO2025/194591
PCT Pub. Date: Sep. 25, 2025

(65) Prior Publication Data
US 2025/0301820 A1    Sep. 25, 2025

(30) Foreign Application Priority Data

Mar. 21, 2024    (CN) .......................... 202410325194.6

(51) Int. Cl.
  H10F 77/30    (2025.01)
  H10F 10/174   (2025.01)
(52) U.S. Cl.
  CPC ......... *H10F 77/311* (2025.01); *H10F 10/174* (2025.01)

(58) Field of Classification Search
None
See application file for complete search history.

(56) References Cited

U.S. PATENT DOCUMENTS 11,489,080 B1    11/2022  Chen et al.
2023/0006076 A1*  1/2023  Xu .................. H10F 10/165

FOREIGN PATENT DOCUMENTS

CN    110838536 A    2/2020
CN    113471321 A    10/2021
(Continued)

OTHER PUBLICATIONS

Machine translation of CN115188837A (Year: 2022).*
(Continued)

*Primary Examiner* — Tamir Ayad
(74) *Attorney, Agent, or Firm* — Taft Stettinius & Hollister LLP

(57) ABSTRACT

The present application relates to a solar cell, a method for manufacturing the same, a photovoltaic module and a photovoltaic system. The solar cell includes: a substrate (110), including a first surface (S1) and a second surface (S2) being opposite to each other, wherein the first surface (S1) has a first region (A) and a second region (B) adjacent to each other in a first direction; a passivating contact layer (120), located in the first region (A) of the first surface (S1); a polysilicon layer (130) located on at least a part of a surface of the passivating contact layer (120) away from the substrate (110); the passivating contact layer (120) including a first tunneling layer (121) and a first doped layer (122), the first tunneling layer (121) and the first doped layer (122) being sequentially stacked on the first region (A) of the first surface (S1) of the substrate (110) in a direction away from the second surface (S2); and a first passivation layer (140), located on a surface of the polysilicon layer (130) away from (Continued)

the passivating contact layer (120) and on the second region (B) of the first surface (S1).

21 Claims, 11 Drawing Sheets

(56) References Cited

FOREIGN PATENT DOCUMENTS

| CN | 115188837 | A | 10/2022 |
|---|---|---|---|
| CN | 115207137 | A | 10/2022 |
| CN | 115513307 | A | 12/2022 |
| CN | 115513308 | A | 12/2022 |
| CN | 115810688 | A | 3/2023 |
| CN | 115832065 | A | 3/2023 |
| CN | 116230783 | A | 6/2023 |
| CN | 116487452 | A | 7/2023 |
| CN | 116666468 | A | 8/2023 |
| CN | 117352563 | A | 1/2024 |
| CN | 117712212 | A | 3/2024 |
| CN | 117936616 | A | 4/2024 |
| WO | 2023213125 | A1 | 11/2023 |

OTHER PUBLICATIONS

Machine translation of CN115832065A (Year: 2023).*
Australian Patent Office, Examination Report No. 1 issued in corresponding Application No. 2024219405, dated Oct. 31, 2024, 5 pp.
Chinese Patent Office ISA/CN, International Search Report & Written Opinion issued in corresponding Application No. PCT/CN2024/096597, Dared Nov. 12, 2024, 11 pp.
Chinese Patent Office, Office Action issued in corresponding Application No. 202410325194.6, dated Apr. 30, 2024, 17 pp.
Chinese Patent Office, Decision of Grant issued in corresponding Application No. 202410325194.6, dated May 21, 2024, 7 pp.

* cited by examiner

SOLAR CELL, METHOD FOR MANUFACTURING THE SAME, PHOTOVOLTAIC MODULE AND PHOTOVOLTAIC SYSTEM

CROSS-REFERENCE TO RELATED APPLICATION

This application is an U.S. national phase application under 35 U.S.C. § 371 based upon international patent application No. PCT/CN2024/096597 filed on May 31, 2024, which itself claims priority to Chinese patent application No. 2024103251946, filed on Mar. 21, 2024, and titled "SOLAR CELL, METHOD FOR MANUFACTURING THE SAME, PHOTOVOLTAIC MODULE AND PHOTOVOLTAIC SYSTEM". The contents of the above identified applications are hereby incorporated herein in their entireties by reference.

TECHNICAL FIELD

The present application relates to the technical field of solar cells, in particular to a solar cell, a method for manufacturing the same, a photovoltaic module, and a photovoltaic system.

BACKGROUND

As photovoltaic technology develops rapidly, the conversion efficiency of crystalline silicon solar cells has been improving year by year. Back contact cell (BC) technology is considered to be the future development direction of crystalline silicon solar cell technology. At present, main types of BC cells are TBC, HPBC, HBC, etc. By moving the PN junction and metal contact to the back of the cell, there is no electrode blocking the front, so that the cell absorbs sunlight over a relatively large area, thereby improving the conversion efficiency and generating more electricity.

In the related art, laser damage will occur to the doped polysilicon in the passivation contact structure during laser patterning in the manufacturing process of BC cells, thereby reducing the efficiency of the solar cell.

SUMMARY

According to various embodiments of the present application, a solar cell, a method for manufacturing the same, a photovoltaic module and a photovoltaic system are provided.

A first aspect of the embodiments of the present application provides a solar cell, including: a substrate, a passivating contact layer, a polysilicon layer, and a first passivation layer. The substrate includes a first surface and a second surface being opposite to each other. The first surface has a first region and a second region adjacent to each other in a first direction. The passivating contact layer is located on the first region of the first surface. The passivating contact layer includes a first tunneling layer and a first doped layer. The first tunneling layer and the first doped layer are sequentially stacked on the first region of the first surface of the substrate in a direction away from the second surface. The polysilicon layer is located on at least a part of a surface of the passivating contact layer away from the substrate. The first passivation layer is located on a surface of the polysilicon layer away from the passivating contact layer and on the second region of the first surface. The first doped layer is made of doped polysilicon. The polysilicon layer is made of intrinsic polysilicon.

A second aspect of the embodiments of the present application provides a method for manufacturing a solar cell, including:
providing a wafer, wherein the wafer includes a substrate and a passivating contact layer;
wherein the substrate includes a first surface and a second surface being opposite to each other, the first surface having a first region and a second region adjacent to each other in a first direction; and the passivating contact layer is located on the first region of the first surface, the passivating contact layer including a first tunneling layer and a first doped layer, wherein the first tunneling layer and the first doped layer are sequentially stacked on the first region of the first surface of the substrate in a direction away from the second surface, the first doped layer is made of doped polysilicon;
forming a polysilicon layer on at least a part of a surface of the passivating contact layer away from the substrate, the polysilicon layer being made of intrinsic polysilicon; and
forming a first passivation layer on a surface of the polysilicon layer away from the passivating contact layer and on the second region of the first surface of the substrate.

A third aspect of an embodiment of the present application provides a photovoltaic module, including at least one cell group. The cell group includes at least two solar cells as described above. Alternatively, the cell group includes at least two solar cells manufactured by the method for manufacturing a solar cell as described above.

A fourth aspect of an embodiment of the present application provides a photovoltaic system, including the photovoltaic module as described above.

The solar cell, the method for manufacturing the same, the photovoltaic module, and the photovoltaic system mentioned above have the following beneficial effects:

The solar cell provided in the embodiment of the present application includes a substrate, a passivating contact layer, a polysilicon layer and a first passivation layer, and the polysilicon layer is disposed between the passivating contact layer and the first passivation layer. As such, the laser can directly act on the polysilicon layer in the subsequent laser process, which reduces the loss of the doped polysilicon introduced into the passivating contact layer and avoids laser damage to the passivating contact layer, thereby improving the photoelectric conversion efficiency of the solar cell.

The details of one or more embodiments of the present disclosure will be illustrated in the following drawings and description. Based on the description, drawings, and claims, those skilled in the art will easily understand other features, purposes, and beneficial effects of the present application.

BRIEF DESCRIPTION OF THE DRAWINGS

To describe the technical solutions in embodiments of the present application or the conventional technology more clearly, the following briefly describes the drawings required for describing the embodiments or the conventional technology. Apparently, the following described drawings are merely for the embodiments of the present application, and other drawings can be derived from the present drawings by those of ordinary skill in the art without any creative effort.

REFERENCE SIGNS

Figure 1:
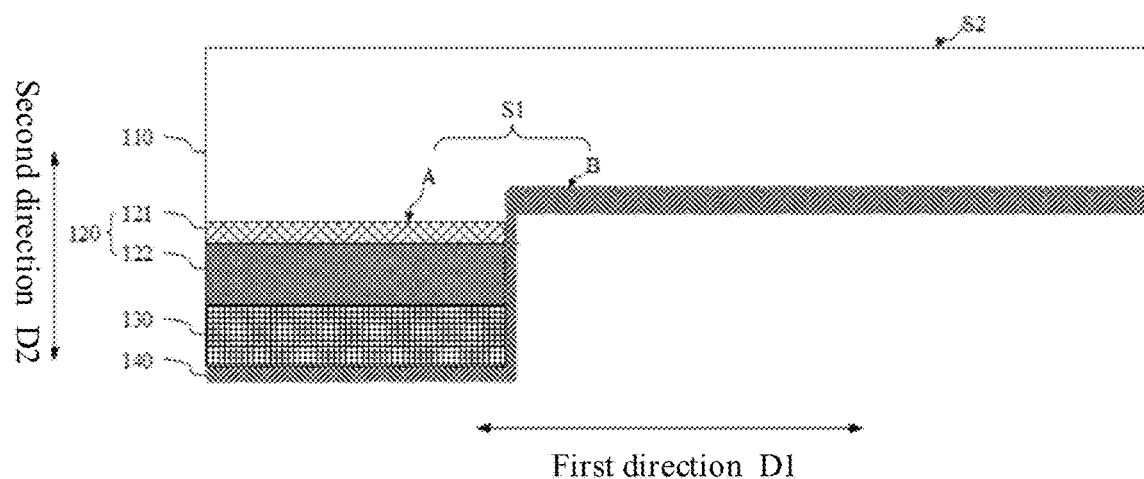
FIG. 1 is a structural schematic view of a solar cell provided in an embodiment of the present application.

110—substrate; S1—first surface; S2—second surface; A—first region; B—second region; 112—first diffusion layer; 120—passivating contact layer; 121—first tunneling layer; 122—first doped layer; 1221—intrinsic portion; 1222—doped diffusion portion; 123—second tunneling layer; 130—polysilicon layer; 140—first passivation layer; 150—second doped layer; 160—transparent conducting layer; 170—first electrode; 180—second electrode; 190—insulating layer; 101—second diffusion region, 102—second passivation layer; 103—anti-reflection layer; 104—partition groove; 200—photovoltaic module; 210—cell group.

DETAILED DESCRIPTION

In the following, the technical solutions in the embodiments of the present application will be described clearly and completely in conjunction with the drawings in the embodiments of the present application. Obviously, the described embodiments are only a part of but not all of the embodiments of the present application. Based on the embodiments in the present application, all other embodiments obtained by ordinary skilled in the art without any creative work shall fall within the scope of protection of the present application.

In order to make the above objects, features and advantages of the present application more comprehensible, specific embodiments of the present application are described in detail below with reference to the drawings. In the following description, many specific details are set forth to make the present application fully understandable. However, the present application can be implemented in many other ways different from those described herein. Similar improvements can be made by those skilled in the art without departing from the spirit of the present application. The present application is not limited to the specific embodiments disclosed below.

In the description of the present application, it should be understood that the terms "center", "longitudinal", "transverse", "length", "width", "thickness", "upper", "lower", "front", "back", "left", "right", "vertical", "horizontal", "top", "bottom", "inner", "outer", "clockwise", "counterclockwise", "axial", "radial", "circumferential" etc. indicate the orientations or positional relationships on the basis of the drawings. These terms are only for the convenience of describing the present application and simplifying the description, rather than indicating or implying that the related devices or element must have the specific orientations, or be constructed or operated in the specific orientations, and therefore cannot be understood as limitations of the present application.

In addition, the terms "first" and "second" are only used for descriptive purposes and cannot be understood as indicating or implying relative importance or implicitly indicating the quantity or order of the indicated technical features. Therefore, the features modified by "first" or "second" may explicitly or implicitly include at least one of the features. In the description of the present application, the "plurality" means at least two, such as two, three, etc., unless otherwise specifically defined.

In the present application, unless otherwise clearly specified and defined, the terms "installed", "connected", "coupled", "fixed" and the like should be understood broadly. For example, an element, when being referred to as being "installed", "connected", "coupled", or "fixed" to another element, unless otherwise specifically defined, may be fixedly connected, detachably connected, or integrated to the other element, may be mechanically connected or electrically connected to the other element, and may be directly connected to the other element or connected to the other element via an intermediate medium. For those skilled in the art, the specific meanings of the above terms in the present application can be understood according to specific circumstances.

In the present application, unless otherwise specifically defined, a first feature, when being referred to as being located "on" or "under" a second feature, may be in direct contact with the second feature or in indirect contact with the second feature via an intermediate medium. Moreover, a first feature, when being referred to as being located "on", "above", "over" a second feature, may be located right above or obliquely above the second feature, or merely located at a horizontal level higher than the second feature. A first feature, when being referred to as being located "under", "below", "beneath" a second feature, may be located right below or obliquely below the second feature, or merely located at a horizontal level lower than the second feature.

It should be noted that an element, when being referred to as being "fixed" or "mounted" to another element, may be directly fixed or mounted to the other element or via an intermediate element. An element, when being referred to as being "connected" to another element, may be directly connected to the other element or via an intermediate element. Such terms as "vertical", "horizontal", "up", "down", "left", "right" and the like used herein are for illustrative purposes only and are not meant to be the only ways for implementing the present application.

The embodiments of the solar cell, the method for manufacturing the same, the photovoltaic module, and the photovoltaic system of the present application will be described below with reference to the drawings.

FIG. 1 is a structural schematic view of a solar cell provided in an embodiment of the present application. Referring to FIG. 1, an embodiment of the present application provides a solar cell. In the embodiment of the present application, the heterojunction back contact (HBC) solar cell, taken as an example of the solar cell, is illustrated for the convenience of explanation. The solar cell may include a substrate 110, a passivating contact layer 120, a polysilicon layer 130, and a first passivation layer 140.

The substrate 110 includes a first surface S1 and a second surface S2 being opposite to each other; wherein the first surface S1 has a first region A and a second region B adjacent to each other in a first direction D1. It can be understood that the substrate 110 has the first surface S1 (or a backlight surface) and the second surface S2 (or a light-receiving surface) that are opposite to each other in a second direction D2 (i.e., the thickness direction of the solar cell). The light-receiving surface and the backlight surface can be understood as the outermost surface of the solar cell facing the sunlight and the outermost surface of the solar cell away from the sunlight respectively. In the embodiment of the present application, the first region A can be flush with the second region B, or the first region A is not flush with the second region B. Optionally, a step is formed between the substrate 110 where the first region A is located and the substrate 110 where the second region B is located. The thickness of the substrate 110 where the first region A is located is greater than or equal to the thickness of the substrate 110 where the second region B is located.

The substrate 110 is configured to receive incident light and generate photogenerated carriers. The substrate 110 can be, but is not limited to, a doped semiconductor substrate, made of a material such as silicon or germanium, or a compound-doped semiconductor substrate, made of a material such as silicon carbide, silicon germanium, gallium arsenide, indium phosphide, zinc oxide, or gallium oxide. For example, in the embodiment of the present application, the substrate 110 can be made of doped monocrystalline silicon. Further, the doping type of the substrate 110 can be an N-type, and an N-type element can be, for example, phosphorus, arsenic, or antimony. Alternatively, the doping type of the substrate 110 can be a P-type, and a P-type element can be, for example, boron or gallium. In the embodiment of the present application, the first surface S1 and the second surface S2 of the substrate 110 will also have certain morphological changes based on the morphology of the film or layer of the cell and other features. For example, the light-receiving surface can be a textured structure; and a part of the backlight surface can be a flat structure, and another part of the backlight surface can be a textured structure.

The passivating contact layer 120 is located on the first region A of the first surface S1. It can be understood that the passivating contact layer 120 is located on the first region A of the backlight surface of the substrate 110. The passivating contact layer 120 can reduce the recombination of carriers on the surface of the substrate 110, thereby increasing the open circuit voltage of the solar cell, and improving the photoelectric conversion efficiency of the solar cell. The passivating contact layer 120 can include a first tunneling layer 121 and a first doped layer 122. The first tunneling layer 121 and the first doped layer 122 are sequentially stacked on the first region A of the first surface S1 of the substrate 110 in a direction away from the second surface S2. The first tunneling layer 121 is configured to achieve the interface passivation of the first surface S1 of the substrate 110, resulting in the chemical passivation effect. By saturating the dangling bonds on the surface of the substrate 110, the density of interface defect state of the first surface S1 of the substrate 110 is reduced, so that the recombination center of the first surface S1 of the substrate 110 is reduced, which in turn reduces the carrier recombination rate. The first tunneling layer 121 has a thickness less than or equal to 3 nanometers. The first tunneling layer 121 can be made of a dielectric material, such as at least one of silicon oxide, amorphous silicon, polycrystalline silicon, silicon carbide, silicon nitride, silicon oxynitride, aluminum oxide, or titanium oxide. The dielectric material can contain the same doping element as that of the substrate 110.

The first doped layer 122 has a thickness greater than or equal to 20 nanometers and less than 600 nanometers. The first doped layer 122 can be made of doped polysilicon, or doped polysilicon containing at least one element of oxygen, carbon, or nitrogen. The doping type of the first doped layer 122 can be the same as, or opposite to, the doping type of the substrate 110.

The polysilicon layer 130 is located on at least a part of a surface of the passivating contact layer 120 away from the substrate 110. The first tunneling layer 121, the first doped layer 122 and the polysilicon layer 130 are sequentially stacked on the first surface S1 in a direction away from the second surface S2. The polysilicon layer 130 can be made of intrinsic polysilicon. Optionally, the doping element in the polysilicon layer 130 includes at least one element of oxygen, carbon, or nitrogen. The polysilicon layer 130 has a thickness of 3 to 150 nanometers.

In the embodiment of the present application, by disposing the polysilicon layer 130 between the first doped layer 122 and the first passivation layer 140, the laser can act on the polysilicon layer 130, for example, the intrinsic poly-Si, in the laser process, thereby reducing the loss of poly-Si introduced into the first doped layer 122, and improving the conversion efficiency of the cell. Meanwhile, by providing the polysilicon layer 130, for example, intrinsic poly-Si, uniform doping can be formed in the contact area of the first doped layer 122, thereby reducing the requirement for the thickness of the first doped layer 122, so that the optical loss in the first doped layer is reduced, and the cell efficiency is improved.

The first passivation layer 140 is located on a surface of the polysilicon layer 130 away from the passivating contact layer 120, and on the second region B of the first surface S1. The first passivation layer 140 has a thickness ranged from 3 to 15 nanometers. The first passivation layer 140 can be made of a material including intrinsic amorphous silicon. Alternatively, the first passivation layer can be made of a material doped with at least one element of oxygen, carbon, or nitrogen, for example, amorphous silicon containing at least one element of oxygen, carbon, or nitrogen.

The solar cell provided in the embodiment of the present application includes a substrate, a passivating contact layer, a polysilicon layer, and a first passivation layer. The polysilicon layer is disposed between the passivating contact layer and the first passivation layer. As such, the laser can act on the polysilicon layer in the subsequent laser process, which reduces the loss of the doped polysilicon introduced into the passivating contact layer and avoids laser damage to the passivating contact layer, thereby improving the photoelectric conversion efficiency of the solar cell.

Figure 2:
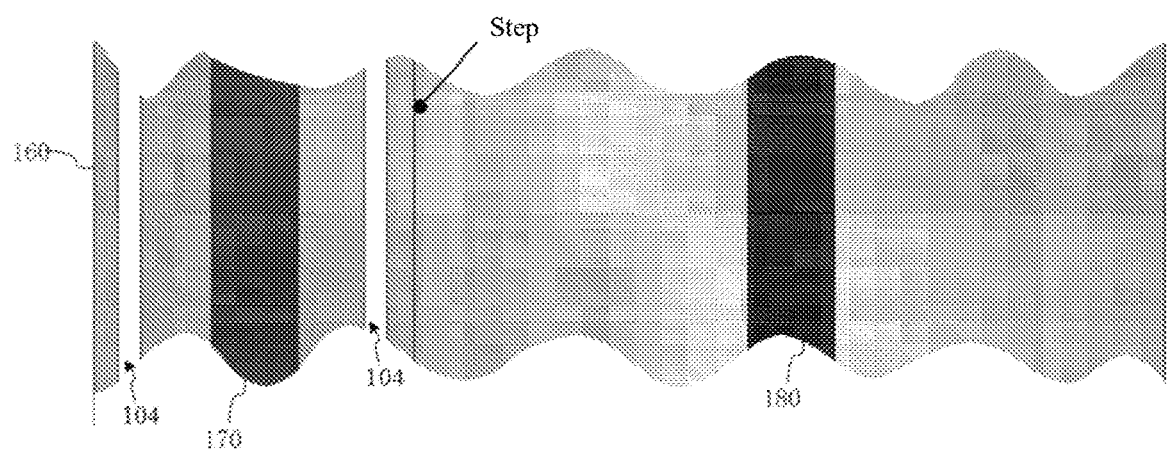
FIG. 2 is a structural top view of a solar cell provided in an embodiment of the present application.
Figure 3:
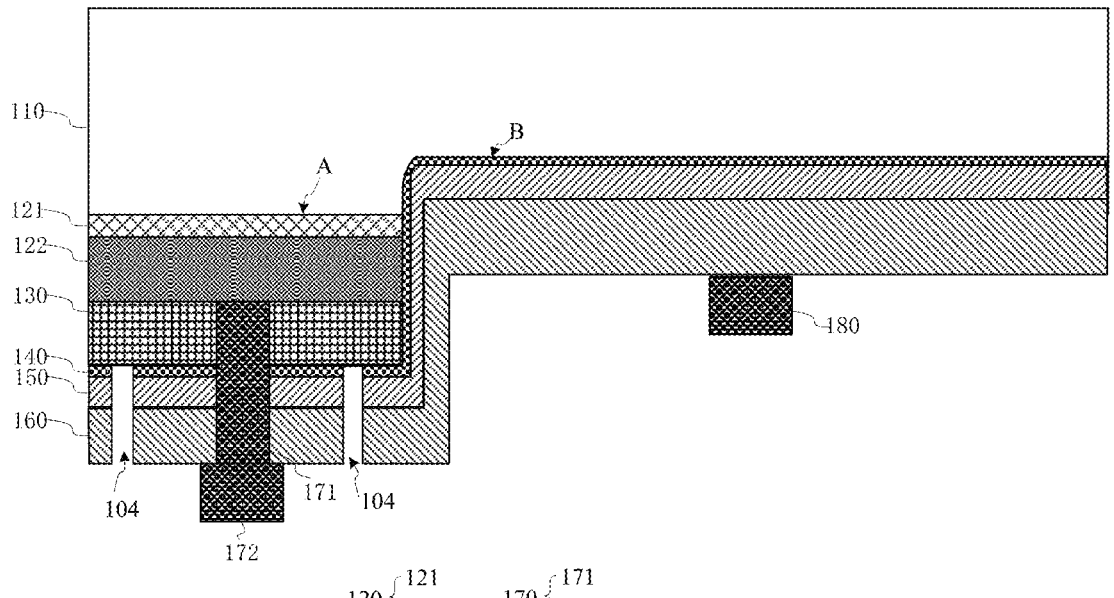
FIG. 3 is another schematic view of a solar cell provided in an embodiment of the present application.

FIG. 2 is a structural top view of a solar cell provided in an embodiment of the present application. FIG. 3 is another schematic view of a solar cell provided in an embodiment of the present application. Referring to FIG. 3, on the basis of the foregoing embodiments, the solar cell provided in the present embodiment can further include a second doped layer 150, a transparent conducting layer 160, a first electrode 170, and a second electrode 180. The second doped layer 150 is located on a surface of the first passivation layer 140 away from the polysilicon layer 130. The second doped layer 150 can be made of a material, including doped amorphous silicon or microcrystalline silicon, or doped amorphous silicon or microcrystalline silicon containing at least one element of oxygen, carbon, or nitrogen. The doping type of the second doped layer 150 is opposite to the doping type of the first doped layer 122. In the present embodiment, the second doped layer 150 has a thickness ranged from 3 to 60 nanometers. In the embodiment of the present application, the first passivation layer 140 and the second doped layer 150 extend from the space where the first region A is located to the space where the second region B is located. It can be understood that the first passivation layer 140 covers the polysilicon layer 130 and the second region B of the second surface S2 of the substrate 110, and the second doped layer 150 covers a side of the first passivation layer 140 away from the substrate 110.

The transparent conducting layer 160 is located on a surface of the second doped layer 150 away from the first passivation layer 140. The transparent conducting layer 160 has a thickness greater than or equal to 10 nanometers and less than or equal to 200 nanometers. The transparent conducting layer 160 can be made of one or more of zinc oxide (ZnO), indium oxide (InO), and tin oxide (SnO). The transparent conducting layer can be doped with one or more of gallium (Ga), tin (Sn), molybdenum (Mo), cerium (Ce), fluorine (F), tungsten (W), and aluminum (Al).

The first electrode 170 is located on the first region, and extends from and passes through the transparent conducting layer 160 to at least the polysilicon layer 130. A first end of the first electrode 170 is in electrical contact with the first doped layer 122, and a second end of the first electrode 170 is in contact with the transparent conducting layer 160 located on the first region A. It can be understood that the first electrode 170 can extend from and pass through the transparent conducting layer 160 to the polysilicon layer 130, and can be in electrical contact with the first doped layer 122 via the transparent conducting layer 160; or the first electrode 170 can extend from and pass through the transparent conducting layer 160 to the first doped layer 122, achieving a direct contact between the first electrode 170 and the first doped layer 122.

The second electrode 180 is located on the second region. The second electrode 180 is in contact with the transparent conducting layer 160. It can be understood that a projection of the second electrode 180 toward the substrate 110 falls within the second region B. The solar cell includes a partition groove 104 disposed in the transparent conducting layer 160. The partition groove 104 is disposed between the first electrode 170 and the second electrode 180 in the first direction, and extends through at least the transparent conducting layer 160. Optionally, the partition groove 104 can pass through the first passivation layer 140, the second doped layer 150, and the transparent conducting layer 160, so as to insulate the first electrode 170 from the second electrode 180. Further, the partition groove 104 is located on the first region. Optionally, the partition groove 104 is located on the second region. Optionally, the partition groove 104 extends across a boundary between the first region and the second region.

In the embodiment of the present application, the first electrode 170 and the second electrode 180 can be made of a material including, but not limited to, one or more of aluminum (Al), titanium (Ti), nickel (Ni), cobalt (Co), silver (Ag), copper (Cu), and tin (Sn). The first electrode 170 and the second electrode 180 can be formed by screen printing, laser transfer, or electroplating. In the embodiment of the present application, the first electrode 170 and the second electrode 180 can be understood as metal grid lines with undefined width and thickness.

The electrical contact between the first electrode 170 and the first doped layer 122 is described below in combination with FIG. 3 to FIG. 6.

Referring to FIG. 3, the transparent conducting layer 160 can be located on the surface of the second doped layer 150 away from the first passivation layer 140. The transparent conducting layer 160 can include a transparent conducting layer segment A and a transparent conducting layer segment B which are integrally formed. An projection of the transparent conducting layer segment A toward the substrate 110 falls within the first region A of the first surface S1 of the substrate 110. An projection of the transparent conducting layer segment B toward the substrate 110 falls within the second region B of the first surface S1 of the substrate 110. In FIG. 3, the transparent conducting layer segment A is stacked on the second doped layer 150. The first electrode 170 extends from and passes through the transparent conducting layer 160 to the first doped layer 122, and the first electrode 170 is in contact with the first doped layer 122. The first electrode 170 can extend to the interface between the first doped layer 122 and the polysilicon layer 130 so as to be in contact with the first doped layer 122. Optionally, the first electrode 170 can extend into the first doped layer 122 so as to be in contact with the first doped layer 122. In the present embodiment, an electrode opening can be formed in the transparent conducting layer 160, the second doped layer 150 and the first passivation layer 140. At least a part of the bottom of the electrode opening is the first doped layer 122, and the first electrode 170 is located in the electrode opening to be in electrical contact with the first doped layer 122. The first electrode 170 can include a first electrode portion 171 and a second electrode portion 172. The first electrode portion 171 is disposed in the electrode opening, and a first end of the first electrode portion 171 is in contact with the first doped layer 122. It can be understood that the first electrode portion 171 extends from and passes through the transparent conducting layer 160 to the first doped layer 122, the first end of the first electrode portion 171 is in contact with the first doped layer 122, a second end of the first electrode portion 171 is in contact with the second electrode portion 172, and the second electrode portion 172 is exposed from the transparent conducting layer segment A.

Figure 4:
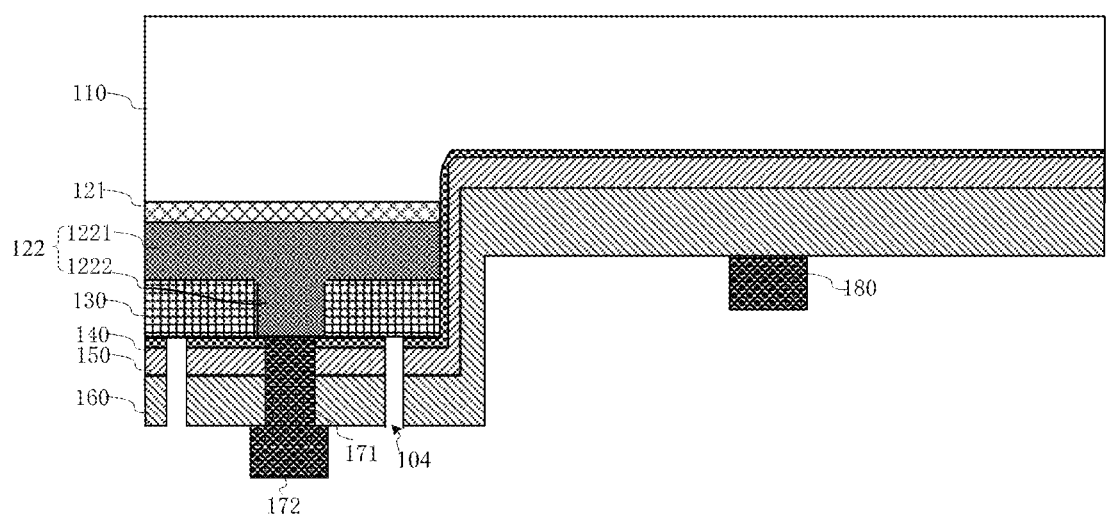
FIG. 4 is another schematic view of a solar cell provided in an embodiment of the present application.

Optionally, referring to FIG. 4, the first doped layer 122 includes an intrinsic portion 1221 and a doped diffusion portion 1222. The intrinsic portion 1221 is located on a surface of the first tunneling layer 121 away from the substrate 110. The polysilicon layer 130 is located on a surface of the intrinsic portion 1221 away from the substrate 110. The doped diffusion portion 1222 is located on a part of a surface of the intrinsic portion 1221 away from the first tunneling layer 121, and diffuses into the polysilicon layer 130 along a direction from the substrate 110 toward the first passivation layer 140. The doped diffusion portion 1222 is in contact with the first electrode 170.

In one embodiment, the doped diffusion portion 1222 can pass through the polysilicon layer 130. Alternatively, the doped diffusion portion 1222 can diffuse into but not pass through the polysilicon layer 130. The doped diffusion portion 1222 can be understood as a contact area being in contact with the first electrode 170 and containing the doped polysilicon doped with a doping element that is the same as or opposite to the doping type of the substrate 110. The doped diffusion portion 1222 can be formed by the heat generated in forming the electrode opening with the laser during the preparation of the solar cell. The generated heat leads to the doping element in the first doped layer 122 to diffuse into the polysilicon layer 130, so as to form a diffusion portion in the polysilicon layer 130.

In the present embodiment, the first doped layer further includes the doped diffusion portion diffused into the polysilicon layer, and the doped diffusion portion can be electrically connected to the first electrode. As such, the doped diffusion portion can collect current, and transmit the collected current to the first electrode through the doped diffusion portion, which reduces or eliminates the short circuit effect between adjacent electrodes, thereby reducing electrical losses and improving the photoelectric conversion efficiency of the solar cell. In addition, the polysilicon layer includes intrinsic polysilicon. The introduction of intrinsic polysilicon can allow the formation of uniform doping in the doped diffusion portion of the first doped layer, which reduces the requirement for the thickness of the first doped layer, so that the optical loss in the first doped layer is reduced, and the photoelectric conversion efficiency of the cell can be further improved.

Figure 5:
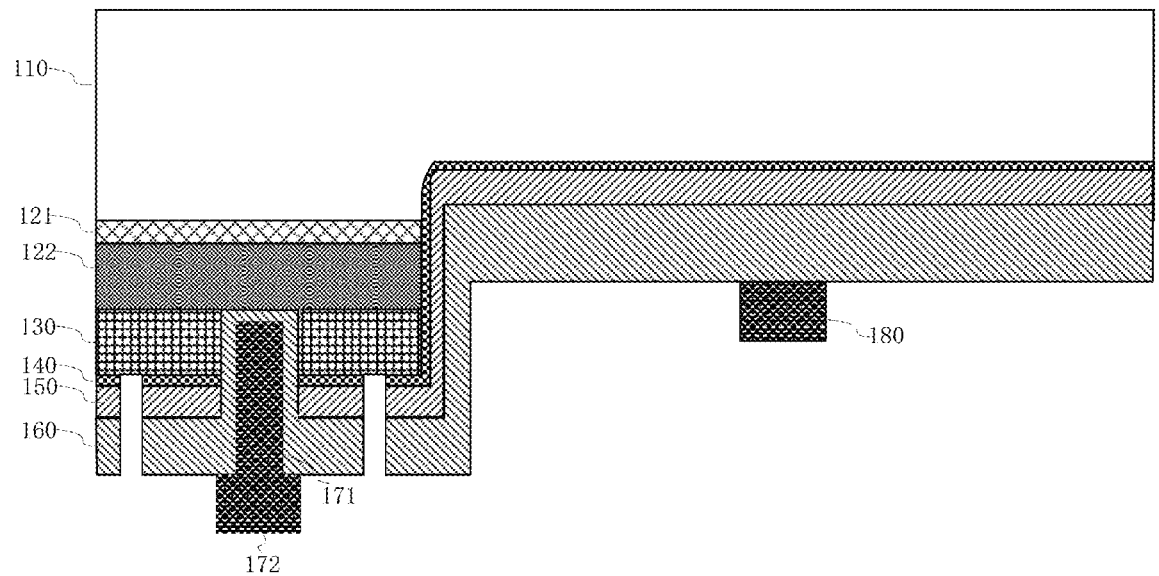
FIG. 5 is another schematic view of a solar cell provided in an embodiment of the present application.
Figure 6:
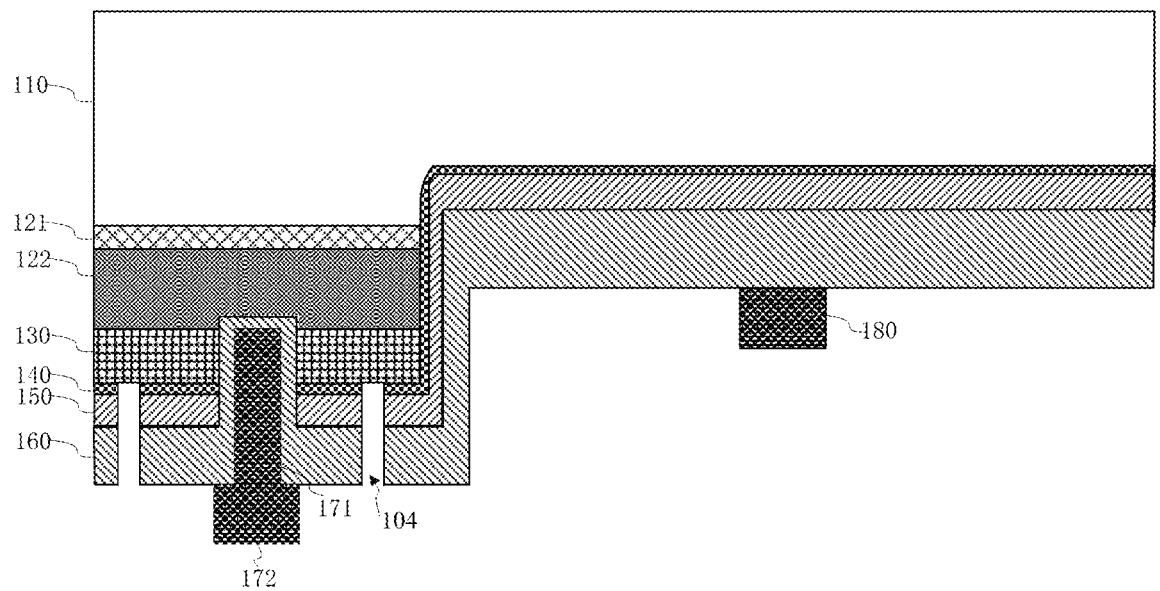
FIG. 6 is another schematic view of a solar cell provided in an embodiment of the present application.

Referring to FIG. 5 and FIG. 6, the transparent conducting layer 160 of the solar cell provided in the present embodiment has a different structure from the transparent conducting layer 160 of the solar cell as shown in FIG. 3 and FIG. 4. In this embodiment, an electrode groove is disposed in the second doped layer 150 and the first passivation layer 140, and at least a part of the bottom of the electrode groove is the first doped layer 122. The transparent conducting layer 160 is located on a surface of the second doped layer 150 away from the first passivation layer 140, and on the bottom and wall of the electrode groove. A part of the first electrode 170 is located in the electrode groove so as to be in electrical contact with the first doped layer 122, and another part of the first electrode 170 is exposed from the electrode groove and is in electrical contact with the transparent conducting layer 160 outside the electrode groove. The first electrode portion 171 of the first electrode 170 is located inside the electrode groove, and can be electrically connected to the first doped layer 122 via the transparent conducting layer 160 located at the bottom of the electrode groove. The second electrode portion 172 of the first electrode 170 is exposed from the transparent conducting layer 160 to be connected to an external power supply device.

Referring to FIG. 5 and FIG. 6, the transparent conducting layer 160 located at the bottom of the electrode groove is completely in contact with the first doped layer 122, so that the first electrode 170 disposed in the electrode groove can be in direct electrical contact with the first doped layer 122. In the embodiment of the present application, as shown in FIG. 5, a contact surface between the transparent conducting layer 160 at the bottom of the electrode groove and the first doped layer 122 can be a partial contact surface between the first doped layer 122 and the polysilicon layer 130. Alternatively, as shown in FIG. 6, the contact surface between the transparent conducting layer 160 at the bottom of the electrode groove and the first doped layer 122 extends inside the first doped layer 122.

Figure 7:
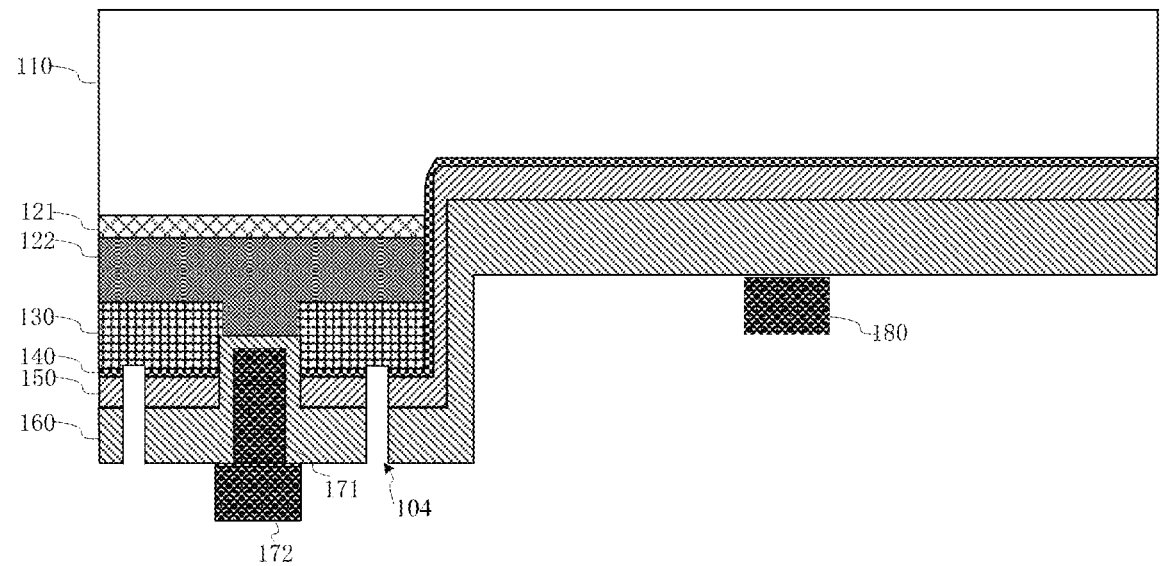
FIG. 7 is yet another schematic view of a solar cell provided in an embodiment of the present application.
Figure 8:
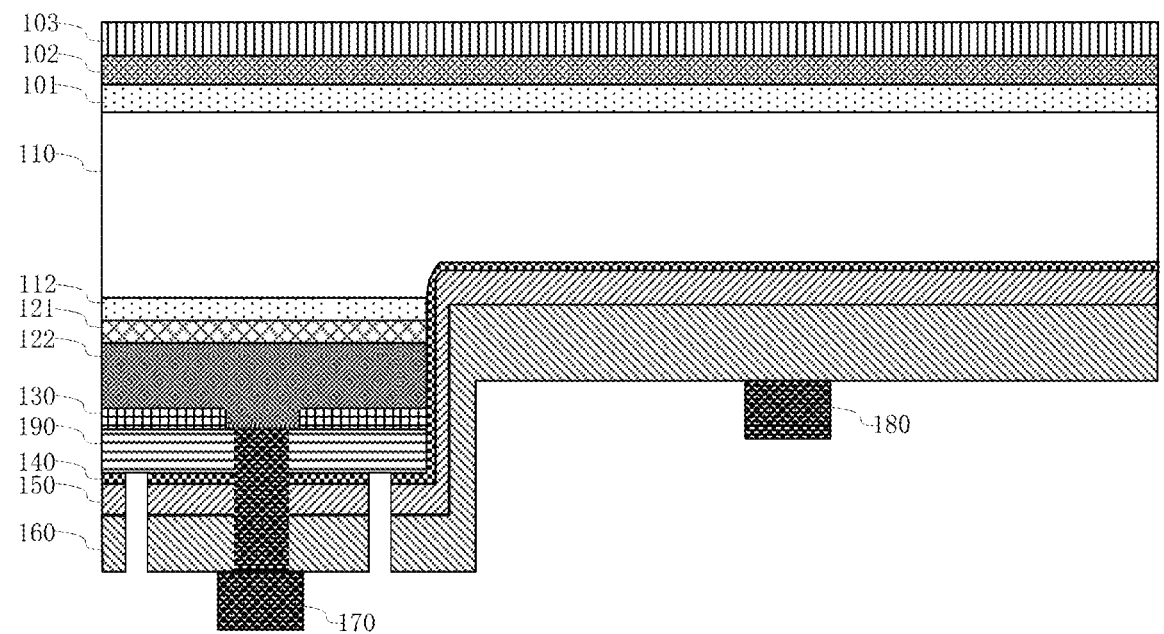
FIG. 8 is yet another schematic view of a solar cell provided in an embodiment of the present application.
Figure 9:
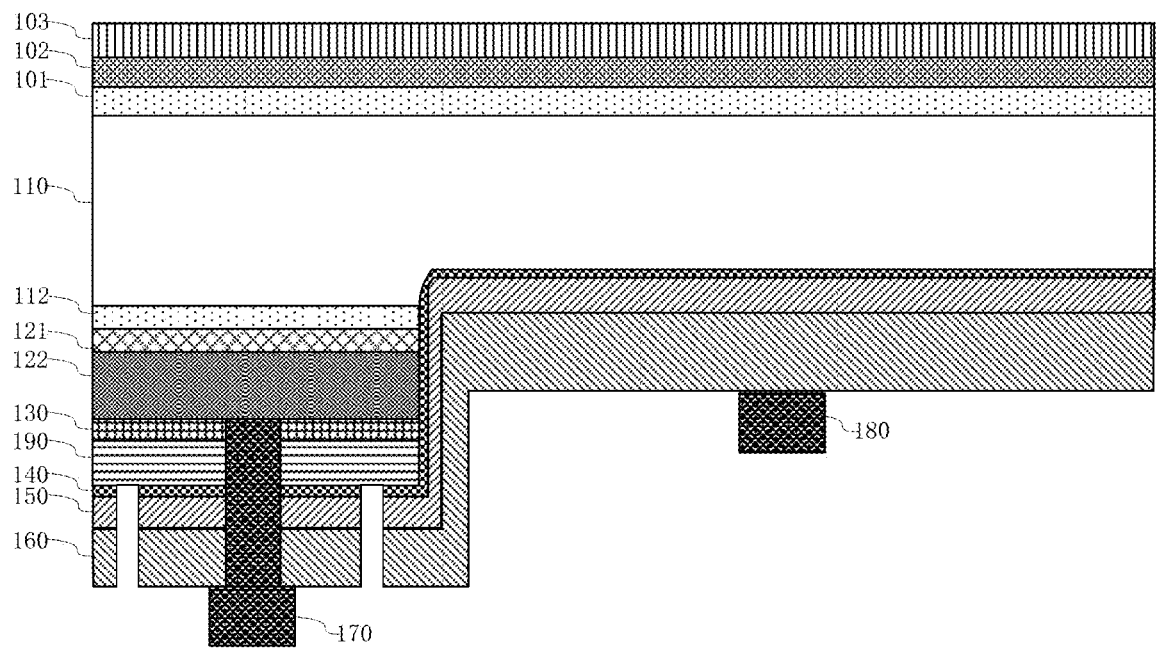
FIG. 9 is yet another schematic view of a solar cell provided in an embodiment of the present application.
Figure 10:
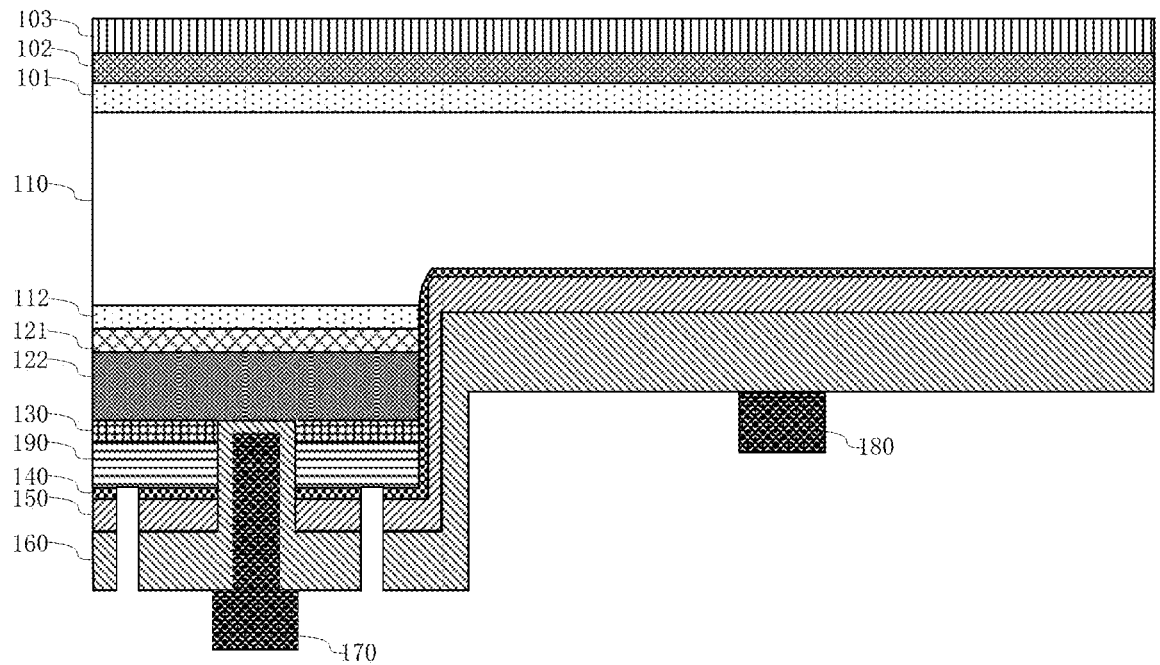
FIG. 10 is yet another schematic view of a solar cell provided in an embodiment of the present application.
Figure 11:
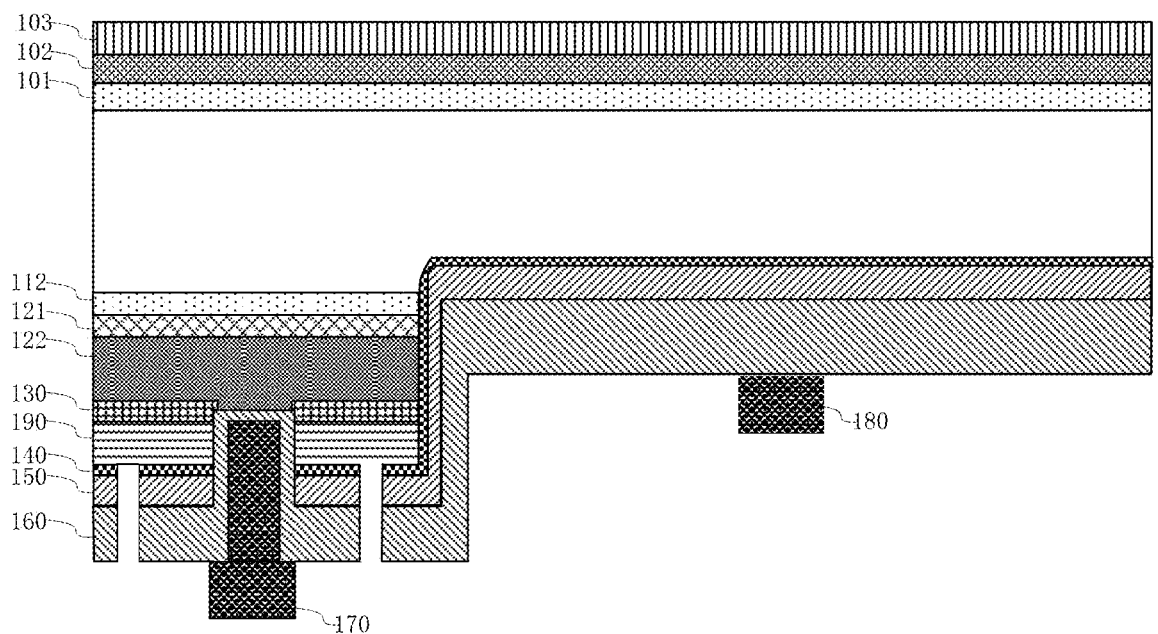
FIG. 11 is still another schematic view of a solar cell provided in an embodiment of the present application.

Referring to FIG. 7, the transparent conducting layer 160 located at the bottom of the electrode groove can be in contact with the doped diffusion portion diffused into the polysilicon layer 130, so that the first electrode 170 is in electrical contact with the doped diffusion portion of the first doped layer 122 via the transparent conducting layer 160. In the embodiment of the present application, the contact surface between the transparent conducting layer 160 located at the bottom of the electrode groove and the first doped layer 122 can be determined based on the diffusion depth of the doped diffusion portion. For example, the contact surface between the transparent conducting layer 160 located at the bottom of the electrode groove and the first doped layer 122 can be a partial contact surface between the first passivation layer 140 and the polysilicon layer 130, or can extend inside the polysilicon layer 130.

In an embodiment, the first electrode is electrically connected to or in electrical contact with the first doped layer via the transparent conducting layer, which can improve the electrical contact stability between the first doped layer and the first electrode, thereby improving the stability of the transmission current and further improving the efficiency of the solar cell.

Referring to FIG. 8 to FIG. 11, on the basis of any of the foregoing embodiments, the solar cell can further include an insulating layer 190. The insulating layer 190 is located on a surface of the polysilicon layer 130 away from the passivating contact layer 120, and is located between the polysilicon layer 130 and the first passivation layer 140. The insulating layer 190 can be made of a material including at least one of a silicon oxide layer, a silicon nitride layer, or a silicon oxynitride layer. The material of the insulating layer 190 can include the same doping element as the material of the first doped layer 122. In the embodiment of the present application, the insulating layer 190 has a thickness greater than or equal to 1.5 nanometers. It should be noted that in the embodiment of the present application, the insulating layer 190 can be present or absent, as needed in actual preparation.

In this embodiment, if the insulating layer 190 is absent in the solar cell, the electrical loss in the contact area between the first doped layer and the second doped layer can be reduced. Alternatively, if the insulating layer 190 is present in the solar cell, the protection of the polysilicon layer and the first doped layer can be increased.

Figure 12:
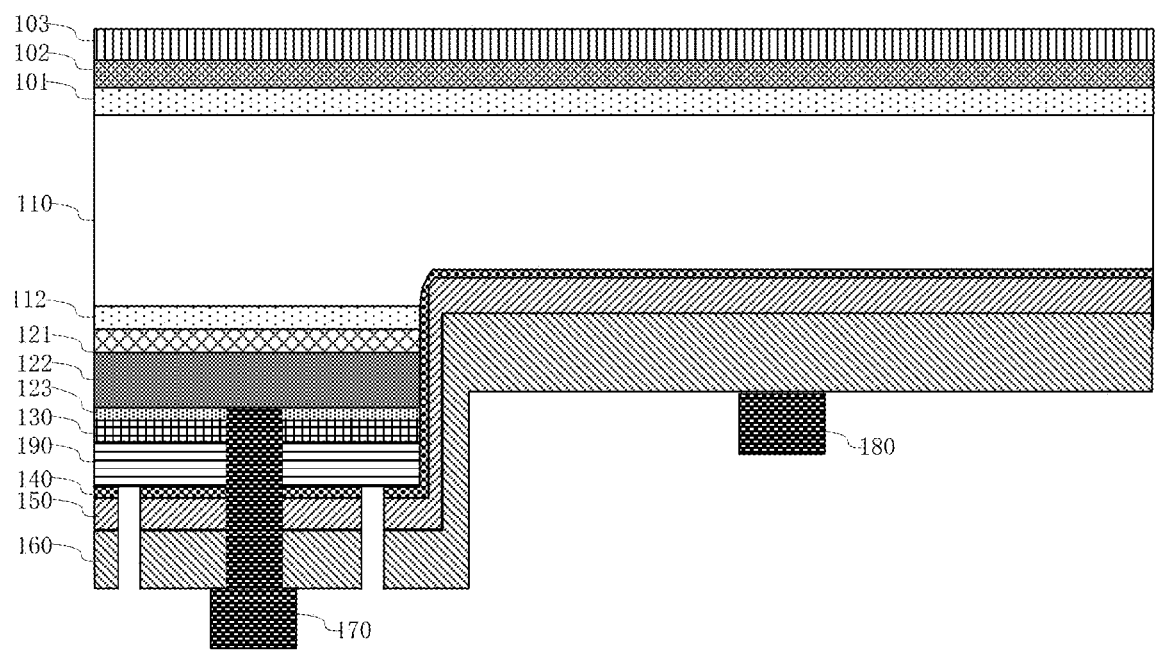
FIG. 12 is still another schematic view of a solar cell provided in an embodiment of the present application.
Figure 13:
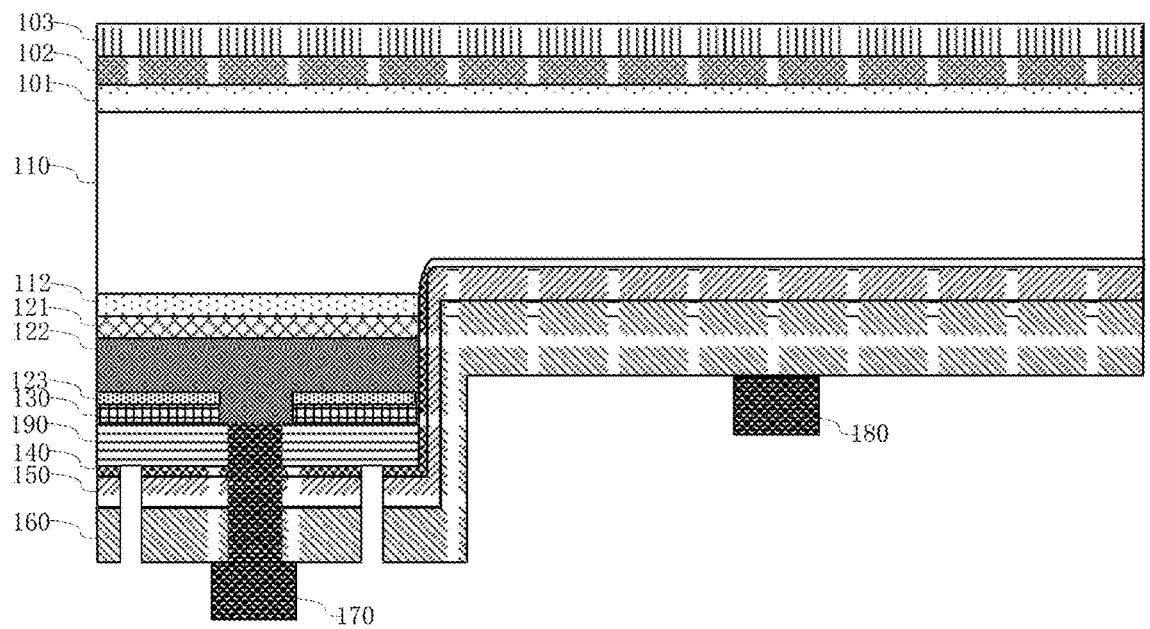
FIG. 13 is still another schematic view of a solar cell provided in an embodiment of the present application.

Referring to FIG. 12, on the basis of the foregoing embodiments, the solar cell provided in the present embodiment can further include a second tunneling layer 123. The second tunneling layer 123 is located on a surface of the first doped layer 122 away from the first tunneling layer 121, and is located between the first doped layer 122 and the polysilicon layer 130. In the embodiment of the present application, the second tunneling layer 123 can be formed by natural oxidation on the first doped layer 122 in the preparation process. Alternatively, the second tunneling layer 123 can also be formed by chemical vapor deposition. The second tunneling layer 123 can be made of a material including at least one of silicon oxide, silicon oxynitride, aluminum oxide, or titanium oxide.

Optionally, the region of the polysilicon layer 130 adjacent to the second tunneling layer 123 is a lightly doped region, wherein the doping type of the lightly doped region is the same as the doping type of the first doped layer 122. Further, in the polysilicon layer 130, the doping concentration in the lightly doped region decreases along a direction from the first tunneling layer 121 toward the first passivation layer 140 until the doping concentration is zero.

In an embodiment of the present application, by disposing the second tunneling layer between the first doped layer and the polysilicon layer, which can be naturally formed in the preparation process, the second tunneling layer can reduce the diffusion of the doping elements in the first doped layer toward the polysilicon layer under low-temperature conditions, and also can reduce the mutual transmission of current between the first doped layer and the polysilicon layer, thereby improving the photoelectric conversion efficiency of the solar cell.

On the basis of any of the foregoing embodiments, continuing to refer to FIG. 8 to FIG. 13, the solar cell provided in the embodiment of the present application can further include a first diffusion layer 112. The first diffusion layer 112 is located on the first region A of the first surface S1 and is located between the substrate 110 and the first tunneling layer 121.

Further, the first diffusion layer 112 includes a crystalline silicon base, wherein the doping conductivity type of the doping element in the crystalline silicon base is the same as the conductivity type of the doping element in the first doped layer 122, and the doping concentration of the doping element in the crystalline silicon base is less than or equal to the doping concentration of the doping element in the first doped layer 122. The doping element in the first doped crystalline silicon has a diffusion depth greater than or equal to 10 nanometers and less than or equal to 1500 nanometers.

In the embodiment of the present application, by disposing the first diffusion layer 112 between the substrate 110 and the first tunneling layer 121, the diffusion of the doping elements in the substrate can be improved.

Optionally, continuing to refer to FIG. 8 to FIG. 13, the solar cell provided in the embodiment of the present application can further include a second diffusion region 101, on the basis of any of the aforementioned embodiments.

Further, the second diffusion region 101 can be made of a material including a second doped crystalline silicon, wherein the doping concentration of the second doped crystalline silicon is greater than the doping concentration of the doping element in the substrate 110. The doping element in the second doped crystalline silicon has a diffusion depth greater than or equal to 10 nanometers and less than or equal to 1500 nanometers. By providing the second diffusion region, the solar cell can have an increased fill factor. In addition, the size ratio of the first electrode to the second electrode can have an increased adjustment range, which can reserve more space for laser patterning, thereby reducing the requirements for the laser beam in the laser patterning process.

In one embodiment, continuing to refer to FIG. 8 to FIG. 13, the solar cell further includes a passivation and anti-reflection layer located on the second surface of the substrate 110. The passivation and anti-reflection layer includes a second passivation layer 102 and an anti-reflection layer 103 stacked on the second surface of the substrate 110. The second passivation layer 102 can be in a single-layer structure or a multi-layer structure. The second passivation layer 102 can be made of at least one of aluminum oxide, silicon oxide, silicon nitride, or silicon oxynitride. Alternatively, the second passivation layer 102 can be made of intrinsic amorphous silicon, or amorphous silicon containing at least one of oxygen, carbon and nitrogen. The second passivation layer 102 can have a thickness greater than or equal to 1.5 nanometers. In addition, the second passivation layer 102 can be formed by chemical deposition. The second passivation layer 102 plays a surface passivation role in the solar cell, and can perform good chemical passivation on the dangling bonds on the surface of the substrate 110.

The anti-reflection layer 103 can be in a single-layer structure or a multi-layer structure. In the anti-reflection layer 103 having the multi-layer structure, each of the layers can be made of silicon oxide, silicon nitride or silicon oxynitride. The anti-reflection layer 103 can have a thickness greater than or equal to 40 nanometers. The anti-reflection layer 103 is located on the backlight surface of the solar cell and has an anti-reflection effect on the back side of the solar cell. Alternatively, in other embodiments, the anti-reflection layer 103 can be omitted.

Figure 14:
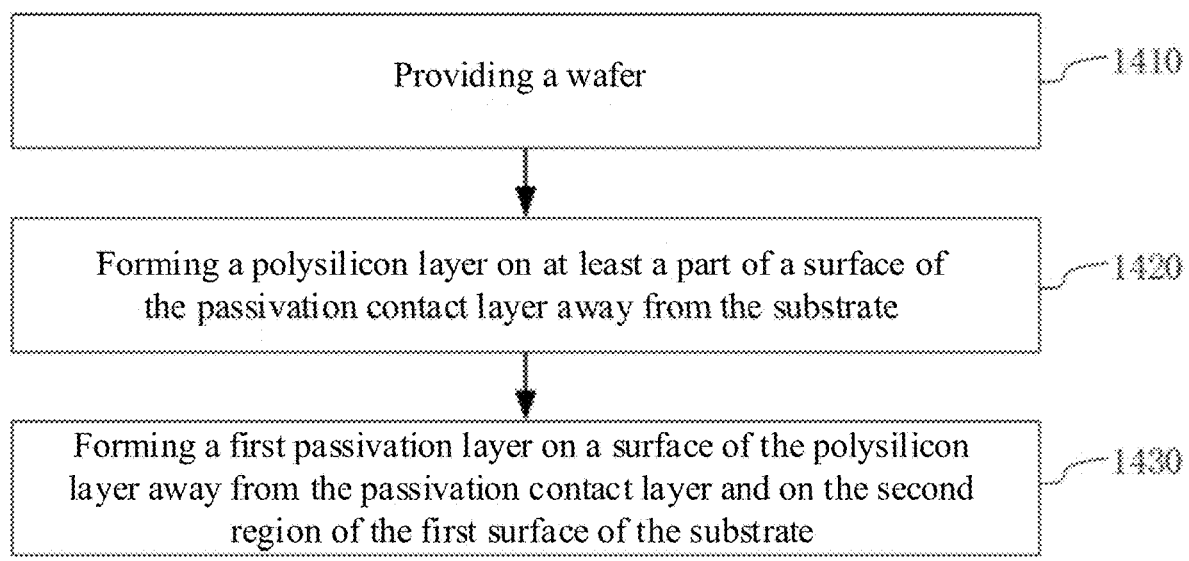
FIG. 14 is a schematic flow chart of a method for manufacturing a solar cell provided in an embodiment of the present application.

FIG. 14 is a schematic flow chart of a method for manufacturing a solar cell provided in an embodiment of the present application.

Figure 15:
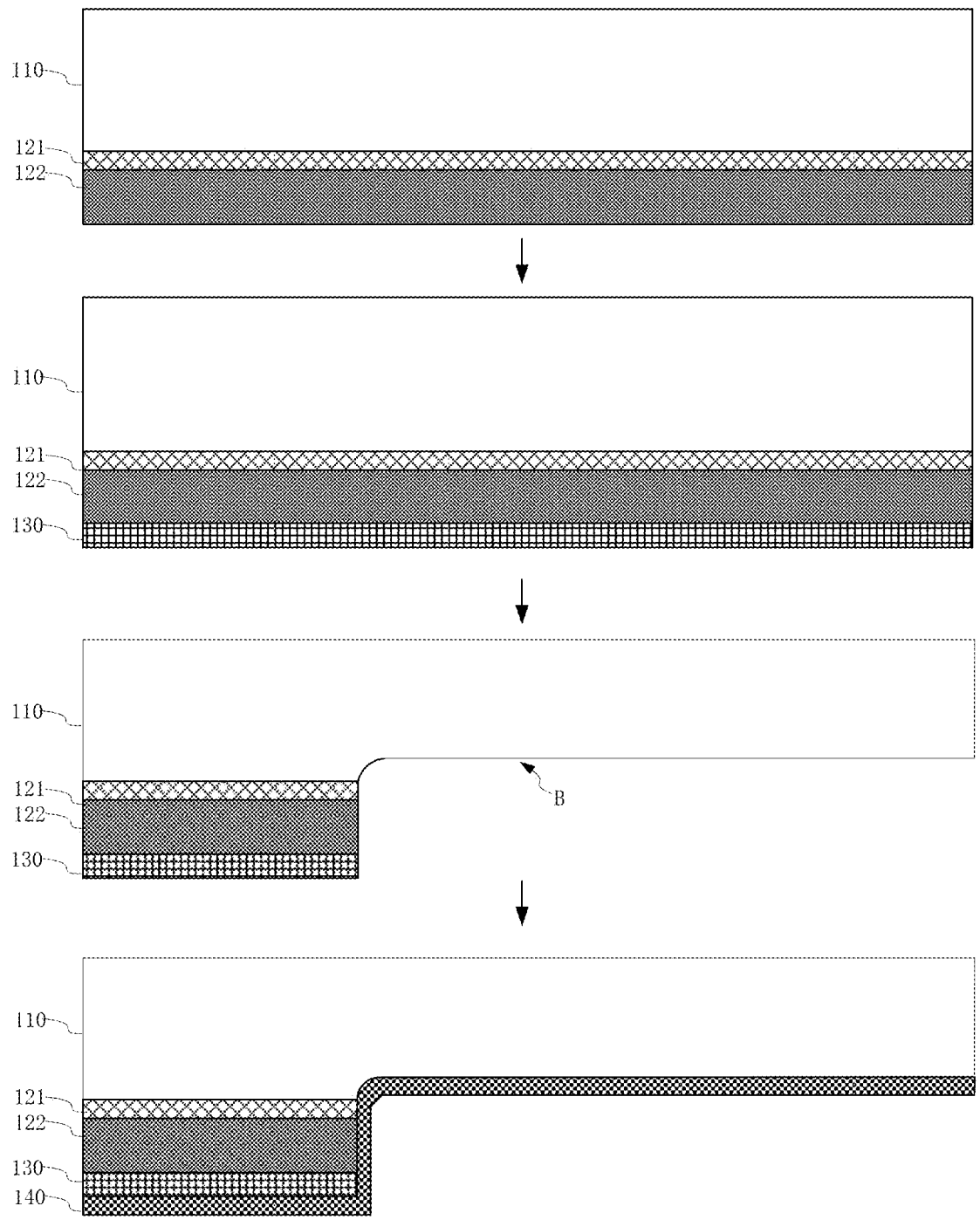
FIG. 15 is a schematic cross-sectional view of a solar cell in a method for manufacturing a solar cell provided in an embodiment of the present application.

This embodiment provides a method for manufacturing a solar cell. The method can be used to manufacture the solar cell in any of the above embodiments. The structure, function, working principle, etc. of the solar cell have been described in detail in the first embodiment and will not be repeated here. In one embodiment, FIG. 15 is a flow chart of a method for manufacturing a solar cell in one embodiment. The method for manufacturing a solar cell includes steps 1410 to 1430.

Step 1410, providing a wafer.

Referring to FIG. 15, the wafer includes a substrate 110 and a passivating contact layer. The substrate 110 includes a first surface S1 and a second surface S2 being opposite to each other. The first surface S1 has a first region A and a second region B adjacent to each other in a first direction. The substrate 110 can be, but is not limited to, a doped semiconductor substrate made of a material such as silicon or germanium, or a compound-doped semiconductor substrate made of a material such as silicon carbide, silicon germanium, gallium arsenide, indium phosphide, zinc oxide, or gallium oxide. Optionally, a part of the surface of the provided substrate 110 can be subjected to a texturing treatment. For example, a doped monocrystalline silicon substrate, taken as an example of the substrate 110, is illustrated. The anisotropic corrosion characteristics of the reaction of silicon substrate in a low-concentration alkali solution allow the formation of a pyramid texture. Further, the dirt on the surface of the silicon substrate and the cutting damage layer can be removed, so that the reflectivity can be reduced and the sunlight absorbed by the silicon substrate can be increased.

In an embodiment of the present application, the passivating contact layer can be formed on the first surface S1 of the substrate 110 by plasma enhanced chemical vapor deposition (PECVD). It is understood that the passivating contact layer is formed on the backlight surface of the substrate 110. Further, the passivating contact layer can include a first tunneling layer 121 and a first doped layer 122, and the first tunneling layer 121 and the first doped layer 122 are sequentially deposited on the first surface S1 of the substrate 110 in a direction away from the second surface S2. The first tunneling layer 121 is configured to achieve the interface passivation of the first surface S1 of the substrate 110, resulting in the chemical passivation effect. By saturating the dangling bonds on the surface of the substrate 110, the density of interface defect state of the first surface S1 of the substrate 110 is reduced, so that the recombination center of the first surface S1 of the substrate 110 is reduced, which in turn reduces the carrier recombination rate.

Step 1420, forming a polysilicon layer on a surface of the passivating contact layer away from the substrate.

Continuing to refer to FIG. 15, the polysilicon layer 130 can be formed on a surface of the first doped layer 122 away from the first tunneling layer 121 by PECVD. The first tunneling layer 121, the first doped layer 122 and the polysilicon layer 130 are sequentially deposited on the first surface S1 of the substrate 110 in a direction away from the second surface S2. It should be noted that the formation process of the polysilicon layer 130 is not limited to the examples in the embodiment of the present application, and can also be formed by other process methods.

Step 1430, forming a first passivation layer on a surface of the polysilicon layer away from the passivating contact layer and on the second region of the first surface of the substrate.

Continuing to refer to FIG. 15, the structure obtained in step 1420 can be subjected to backside patterning treatment to remove a part of the passivating contact layer 120 and a part of the polysilicon layer 130, exposing the substrate 110, so as to obtain the second region on the first surface of the substrate.

The first passivation layer 140 is formed on a surface of the polysilicon layer 130 away from the passivating contact layer 120 (or the first doped layer 122) and on the second region of the first surface of the substrate. Optionally, the method for manufacturing a solar cell can further include cleaning the structure after the back patterning treatment, prior to forming the first passivation layer 140. In the embodiment of the present application, relevant passivation materials, such as intrinsic amorphous silicon, or intrinsic amorphous silicon containing at least one of oxygen, carbon and nitrogen can be deposited, by PECVD, plasma enhanced atomic layer deposition (PEALD), or atomic layer deposition (ALD), etc., on the surface of the polysilicon layer 130 away from the passivating contact layer 120 and on the second region of the first surface of the substrate to form the first passivation layer 140.

It is understandable that the structures, materials, and setting ranges of the substrate 110, the first tunneling layer 121, the first doped layer 122, the polysilicon layer 130, and the first passivation layer 140 have been described in detail in the aforementioned embodiments and will not be repeated here.

According to the method for manufacturing the solar cell provided in the embodiment of the present application, the polysilicon layer is formed on the surface of the passivating contact layer away from the substrate before forming the first passivation layer. As such, the laser can act on the polysilicon layer in the subsequent laser process, which reduces the loss of the doped polysilicon introduced into the passivating contact layer and avoids laser damage to the passivating contact layer, thereby improving the photoelectric conversion efficiency of the solar cell. In addition, without changing the basic HBC process, no nitrogen source is used to form the polysilicon layer before preparing the first passivation layer in the method for manufacturing the solar cell provided in the embodiment of the present application. As such, the photoelectric conversion efficiency of the cell can be further effectively improved.

In one embodiment, after the step of forming a first passivation layer on a surface of the polysilicon layer away from the passivating contact layer and on the second region of the first surface of the substrate, the method for manufacturing the solar cell further includes steps of: forming a second doped layer on a surface of the first passivation layer away from the polysilicon layer; forming a transparent conducting layer and a first electrode on a surface of the second doped layer away from the first passivation layer; forming a second electrode on a surface of the transparent conducting layer away from the first passivation layer, wherein the second electrode is located on the second region.

Figure 16:
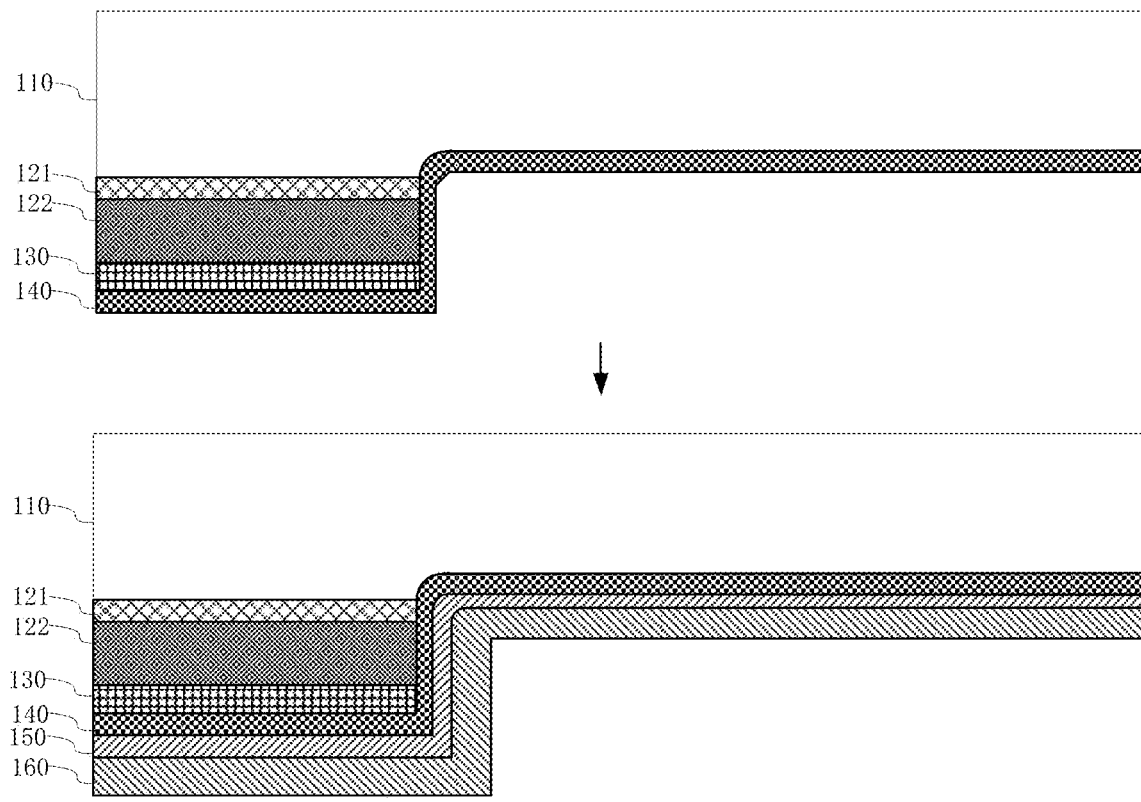
FIG. 16 is a schematic structural view of forming a transparent conducting layer in a method for manufacturing a solar cell provided in an embodiment of the present application.

Referring to FIG. 16, on the basis of the structure shown in FIG. 15, a relevant conductive doping material can be deposited on a surface of the first passivation layer 140 away from the polysilicon layer 130 by PECVD or the like, so as to form a second doped layer 150 on the first passivation layer. Further, a relevant transparent conducting material can be also deposited on the surface of the first passivation layer 140 away from the polysilicon layer 130 by PECVD or the like, so as to form a transparent conducting layer 160 on the second doped layer 150. Referring to FIG. 3, on the basis of the obtained structure, an electrode opening or an electrode groove is formed by laser patterning or the like, and a first electrode 170 is formed by filling an electrode metal material. The first electrode 170 extends from and passes through the transparent conducting layer 160 to at least the polysilicon layer 130. A first end of the first electrode 170 is in electrical contact with the first doped layer 122, and a second end of the first electrode 170 is in contact with the transparent conducting layer 160 located on the first region A. For example, the first electrode 170 is located on the first region, and extends from and passes through the transparent conducting layer 160 to at least the polysilicon layer 130. At least a part of the first electrode 170 is in electrical contact with at least one of the first doped layer 122 and the polysilicon layer 130, and another part of the first electrode 170 is in contact with the transparent conducting layer 160 located on the first region. The resulting structure can be referred to FIG. 3 and FIG. 4.

In one embodiment, the step of forming a transparent conducting layer and a first electrode on a surface of the second doped layer away from the first passivation layer includes: forming a transparent conducting layer on a surface of the second doped layer away from the first passivation layer; forming an electrode opening in the transparent conducting layer, the second doped layer, and the first passivation layer; and forming a first electrode in the electrode opening. At least a part of the bottom of the electrode opening is the first doped layer.

Figure 17:
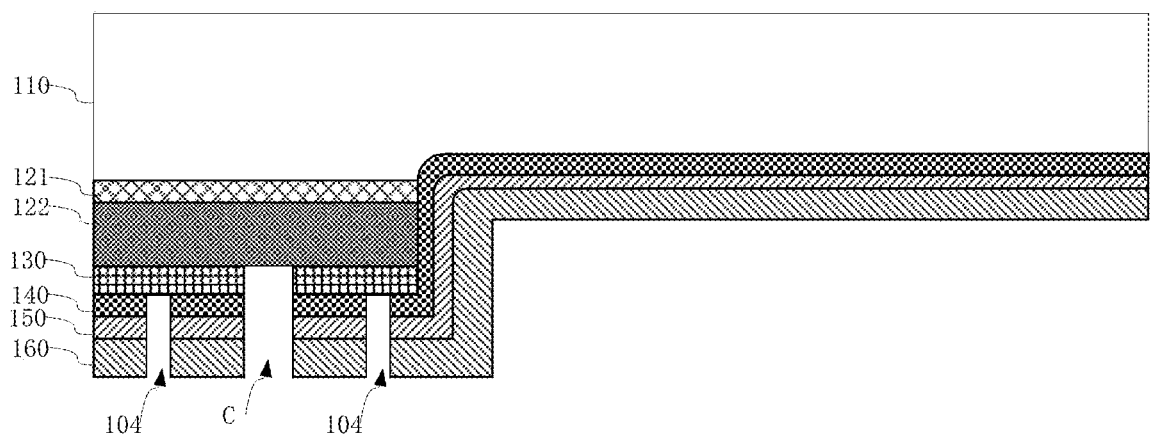
FIG. 17 is a schematic view of forming an electrode opening in a method for manufacturing a solar cell provided in an embodiment of the present application.

Referring to FIG. 17, a relevant transparent conducting material can be deposited on the surface of the first passivation layer 140 away from the polysilicon layer 130 by PECVD or the like, so as to form the transparent conducting layer 160 on the second doped layer 150. On the basis of the obtained structure, an electrode opening C can be formed in the transparent conducting layer 160, the second doped layer 150, the first passivation layer 140 and part of the polysilicon layer 130. A first electrode 170 can be formed in the electrode opening C. The obtained structure can refer to FIG. 3 and FIG. 4. The electrode opening C can be formed by a laser patterning process, wherein the electrode opening C can be opened to the polysilicon layer 130, and the first electrode 170 in the electrode opening C can be in electrical contact with the doped diffusion portion 1222 diffused into the polysilicon layer. Alternatively, the electrode opening C can be opened to the first doped layer 122, and the first electrode 170 in the electrode opening C can be in contact with the first doped layer 122.

Further, before forming the first electrode 170, the transparent conducting layer 160, the second doped layer 150, and the first passivation layer 140 can be subjected to patterning treatment to form a partition groove 104. Further, during forming the first electrode 170, the second electrode 180 can be also formed on the transparent conducting layer. The first electrode 170 is insulated from the second electrode 180 by the partition groove 104.

Figure 18:
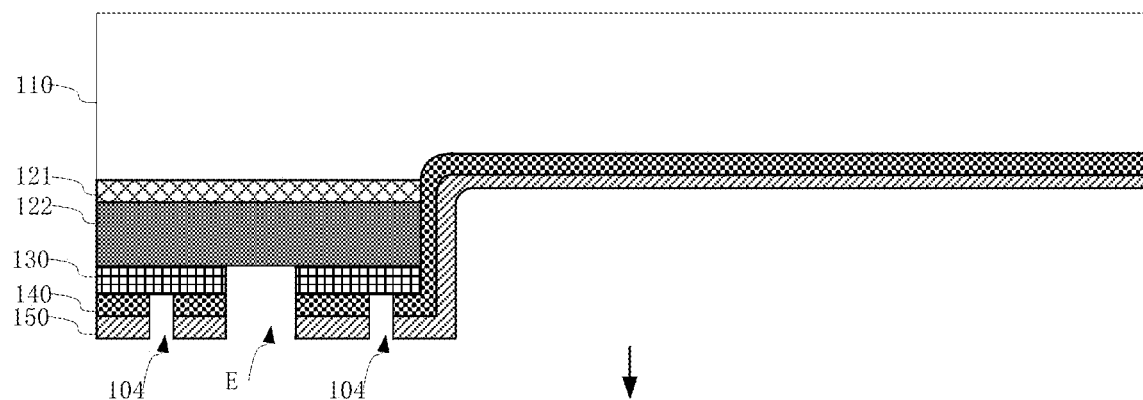
FIG. 18 is a schematic view of forming a transparent conducting layer in a method for manufacturing a solar cell provided in another embodiment of the present application.
Figure 18:
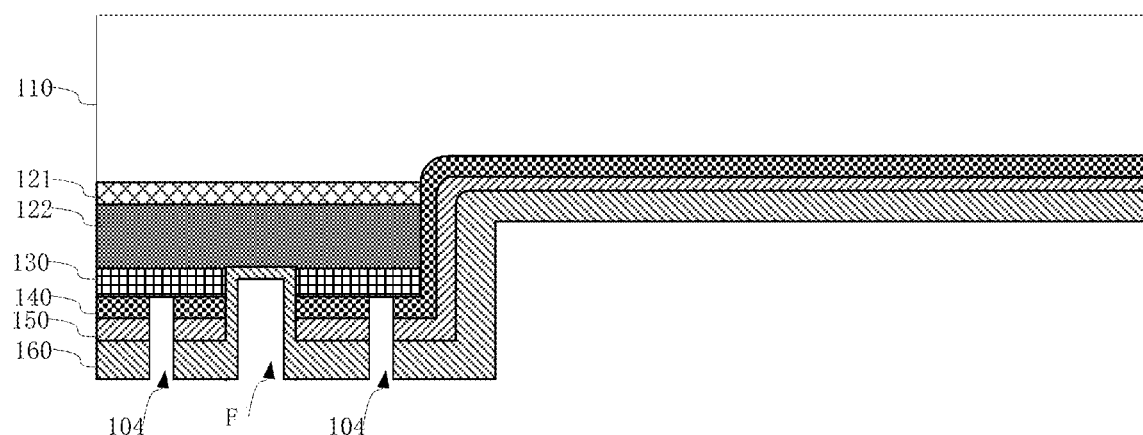

Optionally, referring to FIG. 18, in one embodiment, the step of forming a transparent conducting layer and a first electrode on a surface of the second doped layer away from the first passivation layer includes: forming an electrode groove in the transparent conducting layer, the second doped layer, and the first passivation layer; forming an transparent conducting layer on a surface of the second doped layer away from the first passivation layer, and on the wall and bottom of the electrode groove; and forming a first electrode in the remaining region of the electrode groove. Different from the foregoing embodiments, the transparent conducting layer 160 in the embodiment of the present application is formed after forming the electrode groove. An electrode groove E can be formed by a laser patterning process, wherein the electrode groove E can be opened to the polysilicon layer 130, or can be opened to the first doped layer 122. A relevant transparent conducting material can be deposited on the surface of the second doped layer 150 away from the first passivation layer 140 by PECVD or the like, so as to form the transparent conducting layer on the second doped layer 150 as well as on the wall and bottom of the electrode groove E. On the basis of the obtained structure, the first electrode 170 is formed in the remaining region F in the electrode groove. The obtained structure can be referred to FIG. 5 to FIG. 7.

In an embodiment, the first electrode is electrically connected to or in electrical contact with the first doped layer via the transparent conducting layer, which can improve the electrical contact stability between the first doped layer and the first electrode, thereby improving the stability of the transmission current and further improving the efficiency of the solar cell.

In one embodiment, the method for manufacturing the solar cell further includes a step of performing laser local heat treatment on the polysilicon layer, so that the doping elements in the first doped layer diffuse into the polysilicon layer to form a doping diffusion portion in the polysilicon layer. Referring to FIG. 4 and FIG. 7, the first doped layer 122 includes an intrinsic portion 1221 and a doping diffusion portion 1222. The intrinsic portion 1221 is located on a surface of the first tunneling layer 121 away from the substrate 110. The heat treatment can be understood as a large amount of heat generated in the laser patterning process during forming the electrode opening or the electrode groove by laser patterning. The generated heat acts on the polysilicon layer 130 and is transferred to the first doped layer 122, rendering the doping elements in the first doped layer 122 to diffuse into the polysilicon layer 130 to form the doping diffusion portion 1222 in the polysilicon layer 130. It should be noted that the heat treatment is not limited to the example of the present application, and can also be performed by other processes to form the doping diffusion portion 1222 in the polysilicon layer 130. As such, the formed first electrode 170 can be in electrical contact with the doped diffusion portion 1222 so as to transmit the current collected by the doped diffusion portion 1222.

In the present embodiment, in the process of forming the first doped layer, the first doped layer can be diffused into the polysilicon layer to form a doped diffusion portion. The doped diffusion portion can be electrically connected to the first electrode. As such, the doped diffusion portion can collect current and the collected current can be transmitted to the first electrode through the doped diffusion portion, which can prevent the first doped layer and the second doped layer in the second region from short-circuiting, thereby reducing the electrical losses and improving the photoelectric conversion efficiency of the solar cell. In addition, the polysilicon layer includes intrinsic polysilicon. The formation of intrinsic polysilicon can allow the first doped layer to diffuse into the polysilicon layer and form uniform doping in the doped diffusion portion, which reduces the requirement for the thickness of the first doped layer, thereby reducing the optical loss in the first doped layer, and further improving the photoelectric conversion efficiency of the cell.

Figure 19:
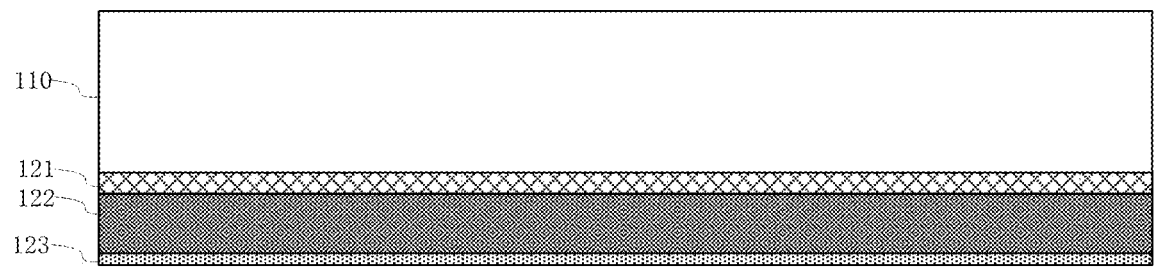
FIG. 19 is a schematic view of forming a second tunneling layer in a method for manufacturing a solar cell provided in an embodiment of the present application.

In one embodiment, before the step of forming a polysilicon layer on at least a part of a surface of the passivating contact layer away from the substrate, the method for manufacturing the solar cell further includes a step of forming a second tunneling layer on a surface of the first doped layer away from the substrate. Referring to FIG. 19, before forming the polysilicon layer 130, the first doped layer 122 is exposed, and its exposed surface is oxidated with the oxygen in the environment, to form a second tunneling layer 123.

In an embodiment of the present application, by forming the second tunneling layer on the surface of the first doped layer adjacent to the polysilicon layer, the second tunneling layer is located between the first doped layer and the polysilicon layer in the solar cell, and can be naturally formed in the preparation process environment. The formed second tunneling layer can reduce the diffusion of the doping elements in the first doped layer toward the polysilicon layer under low-temperature conditions, and also can reduce the mutual transmission of current between the first doped layer and the polysilicon layer, thereby improving the photoelectric conversion efficiency of the solar cell.

Figure 20:
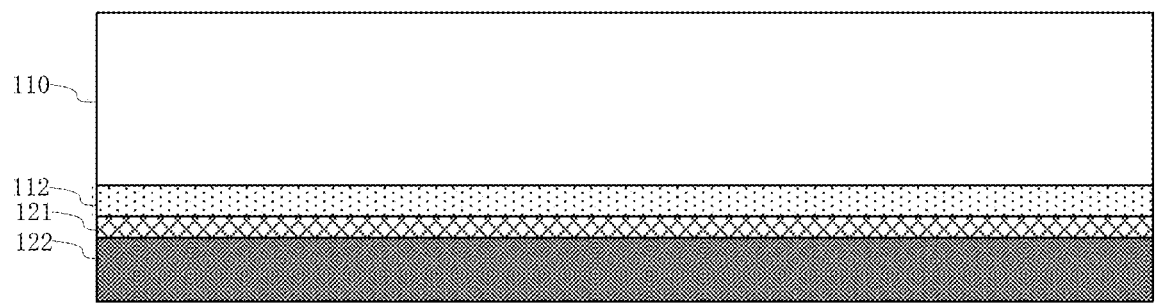
FIG. 20 is a schematic structural view of forming a first diffusion layer in a method for manufacturing a solar cell provided in an embodiment of the present application.

In one embodiment, the step of providing a wafer includes steps of providing a substrate including a first surface and a second surface being opposite to each other, and sequentially stacking a first diffusion layer, a first tunneling layer and a first doped layer on the first surface of the substrate in a direction away from the second surface. On the basis of the foregoing embodiments, the wafer in the embodiment of the present application also includes a first diffusion layer formed before the formation of the first tunneling layer. Referring to FIG. 20, in the embodiment of the present application, a relevant diffusion material can be deposited on the first surface S1 of the substrate 110 by plasma enhanced chemical vapor deposition (PECVD) or the like to form the first diffusion layer 112. Then, the first tunneling layer 121 and the first doped layer 122 are sequentially formed on the surface of the first diffusion layer 112 away from the substrate 110.

In the embodiment of the present application, by forming the first diffusion layer 112 between the first doped layer 122 and the polysilicon layer 130, the diffusion of the doping elements in the substrate and the doping elements in the first doped layer can be improved.

Figure 21:
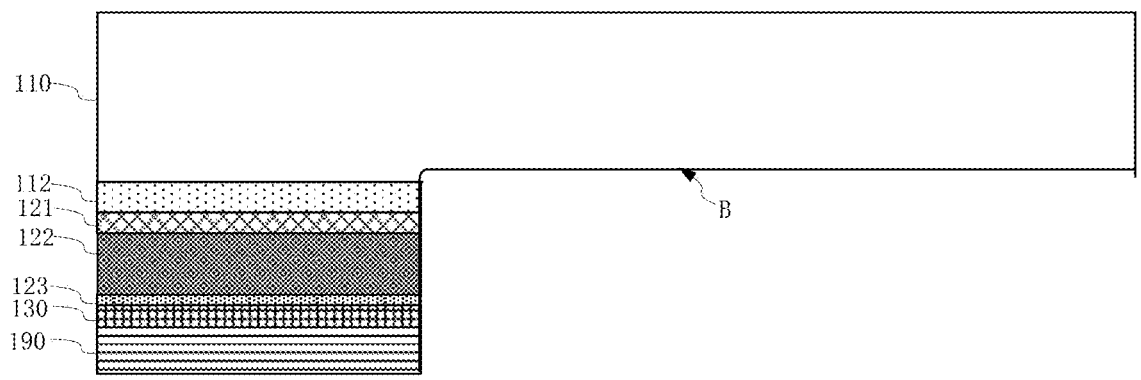
FIG. 21 is a schematic structural view of forming an insulating layer in a method for manufacturing a solar cell provided in an embodiment of the present application.

In one embodiment, after sequentially stacking the first diffusion layer, the first tunneling layer and the first doped layer on the first surface of the substrate in a direction away from the second surface, the method for manufacturing the solar cell further includes steps of forming an insulating layer on a surface of the first doped layer away from the first tunneling layer; and removing a part of the first diffusion layer, a part of the first tunneling layer, a part of the first doped layer, and a part of the insulating layer to expose the second region of the substrate. Referring to FIG. 21, the insulating layer 190 and the polysilicon layer 130 can be prepared using the same process equipment. Exemplarily, the insulating layer 190 can be formed on a side of the polysilicon layer 130 away from the second tunneling layer 123, and then a part of the first diffusion layer 112, a part of the first tunneling layer 121, a part of the first doped layer 122 and a part of the insulating layer 190 are removed by patterning to expose the second region B of the substrate.

In the embodiment of the present application, the insulating layer 190 can be completely removed. If the insulating layer 190 is completely removed, the manufactured solar cell has no insulating layer between the polysilicon layer 130 and the first passivation layer 140, which can reduce the electrical loss of the contact area between the first doped layer and the second doped layer. Alternatively, the insulating layer 190 can be partially removed to retain the insulating layer 190 located between the polysilicon layer 130 and the first passivation layer 140, which can increase the protection to the polysilicon layer and the first doped layer, and can also reduce or eliminate the short circuit effect between adjacent electrodes.

Figure 22:
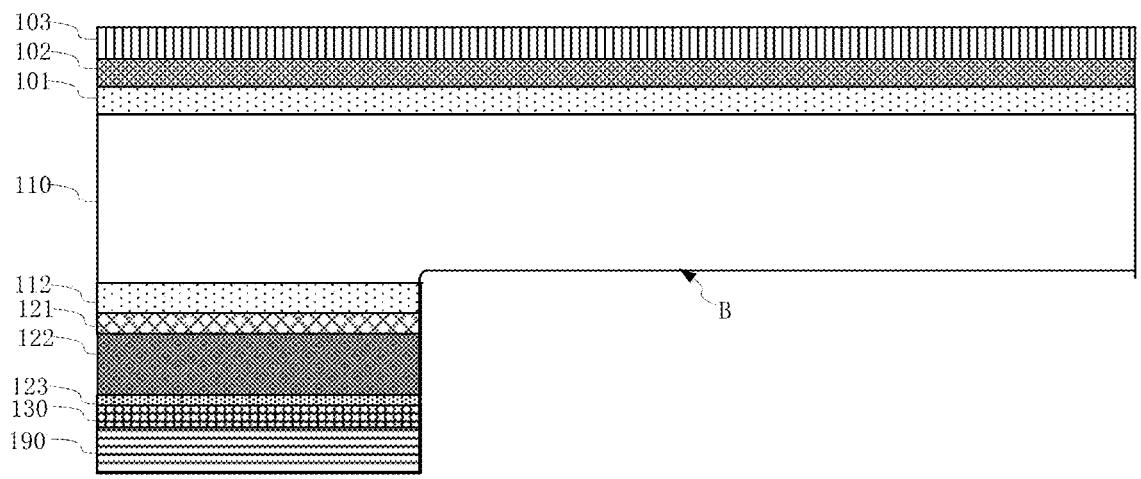
FIG. 22 is a schematic view of forming a second diffusion region, a second passivation layer and an anti-reflection layer on a wafer in a method for manufacturing a solar cell provided in an embodiment of the present application.

In one embodiment, the solar cell preparation method further includes a step of forming a second diffusion region, a second passivation layer and an anti-reflection layer sequentially on the second surface of the substrate. As shown in FIG. 22, in the embodiment of the present application, the second diffusion region 101 can be formed simultaneously with the first diffusion layer 112, and the second diffusion region 101 is formed on the second surface S2 of the substrate 110. The second diffusion region 101 is formed based on the same formation principle as the formation principle of the first diffusion layer 112, which will not be repeated here. Further, after forming the second diffusion region 101, a second passivation layer 102 and an anti-reflection layer 103 can be sequentially deposited on a side of the second diffusion region 101 away from the substrate. In the embodiment of the present application, by forming the second diffusion region, the solar cell can have an increased fill factor. In addition, the size ratio of the first electrode to the second electrode can have an increased adjustment range, which can reserve more space for laser patterning, thereby reducing the requirements for the laser beam in the laser patterning process.

Figure 23:
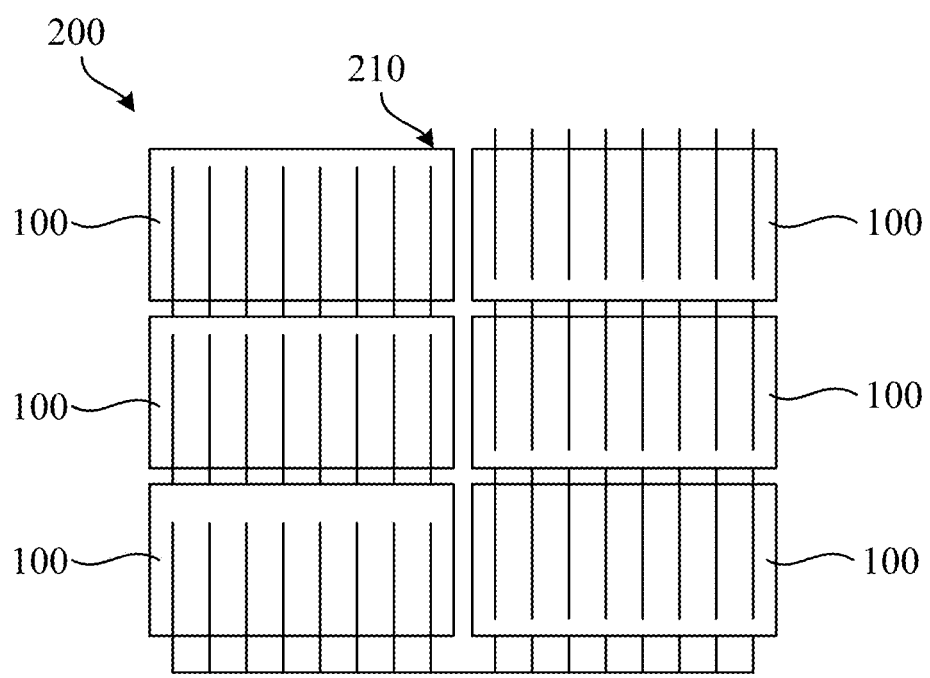
FIG. 23 is a structural schematic view of a photovoltaic module provided in an embodiment of the present application.

FIG. 23 is a structural schematic view of a photovoltaic module provided in an embodiment of the present application. Referring to FIG. 23, the present embodiment provides a photovoltaic module 200 including at least one cell group 210. The cell group 210 includes at least two solar cells 100 in any of the aforementioned embodiments. The solar cells 100 can be connected together by serial welding.

For example, a plurality of solar cells 100 can be connected in series through a welding strip, so as to collect the electric energy generated by separate solar cell 100 for subsequent transmission. Of course, the solar cells can be spaced from each other, or can be stacked together in an imbricated form.

For example, the photovoltaic module 200 further includes an encapsulation layer and a cover plate (not shown). The encapsulation layer is configured to cover the surface of the cell group 210. The cover plate is configured to cover the surface of the encapsulation layer away from the cell group 210. The solar cells are electrically connected into a whole piece or multiple pieces, to form a plurality of cell groups 210. The plurality of cell groups 210 are electrically connected to each other in series and/or in parallel. In some embodiments, the plurality of cell groups 210 can be electrically connected through conductive strips. The encapsulation layer covers the surface of the solar cells. For example, the encapsulation layer can be an organic encapsulation film, such as an ethylene-vinyl acetate copolymer film, a polyethylene-octene elastomer film, or a polyethylene terephthalate film. The cover plate can be a plate with a light-transmitting function, such as a glass cover plate, a plastic cover plate, or the like.

The present embodiment provides a photovoltaic system (not shown), including the aforementioned photovoltaic module. The photovoltaic system can be applied to photovoltaic power stations, such as ground power stations, roof power stations, water surface power stations, etc. Alternatively, the photovoltaic system can be applied to equipment or devices that use solar energy to generate electricity, such as user solar power supplies, solar street lights, solar cars, solar buildings, etc. It can be understood that the application scenarios of the photovoltaic system are not limited to the above, that is, the photovoltaic system can be applied in all fields that need to use solar energy to generate electricity. Taking a photovoltaic power generation network as an example, the photovoltaic system can include photovoltaic arrays, a combiner box, and an inverter. The photovoltaic array can be an array of multiple photovoltaic modules. For example, the multiple photovoltaic modules can form multiple photovoltaic arrays. The photovoltaic arrays are connected to the combiner box, which can combine the currents generated by the photovoltaic arrays. The combined current flows through the inverter and is converted into the alternating current suitable for the urban power grid, and then connected to the power grid to realize solar power supply.

The technical features of the above embodiments can be combined arbitrarily. In order to make the description concise, not all possible combinations of the technical features are described in the embodiments. However, as long as there is no contradiction in the combination of these technical features, the combinations should be considered as in the scope of the present application.

The above-described embodiments are only several implementations of the present application, and the descriptions are relatively specific and detailed, but they should not be construed as limiting the scope of the present application. It should be understood by those of ordinary skill in the art that various modifications and improvements can be made without departing from the concept of the present application, and all fall within the protection scope of the present.

Therefore, the patent protection of the present application shall be defined by the appended claims.

What is claimed is:

1. A solar cell comprising:
a substrate, comprising a first surface and a second surface being opposite to each other; wherein the first surface has a first region and a second region adjacent to each other in a first direction;
a passivating contact layer, located on the first region of the first surface; the passivating contact layer comprising a first tunneling layer and a first doped layer, wherein the first tunneling layer and the first doped layer are sequentially stacked on the first region of the first surface of the substrate in a direction away from the second surface, and the first doped layer is made of doped polysilicon;
a polysilicon layer, located on at least a part of a surface of the passivating contact layer away from the substrate, the polysilicon layer being made of intrinsic polysilicon;
a first passivation layer, located on a surface of the polysilicon layer away from the passivating contact layer and on the second region of the first surface;
a second doped layer, located on a surface of the first passivation layer away from the polysilicon layer;
a transparent conducting layer, located on a surface of the second doped layer away from the first doped layer;
a first electrode located on the first region, extending from and passing through the transparent conducting layer to at least the polysilicon layer, wherein at least a part of the first electrode is in contact with at least one of the first doped layer and the polysilicon layer, and another part of the first electrode is in contact with the transparent conducting layer; and
a second electrode located on the second region, wherein the second electrode is in contact with the transparent conducting layer.

2. The solar cell according to claim 1, wherein the first doped layer comprises an intrinsic portion and a doped diffusion portion, wherein the doped diffusion portion is located on a part of a surface of the first doped layer away from the first tunneling layer, and extends through the polysilicon layer along a direction from the substrate toward the first passivation layer; and the doped diffusion portion is in contact with the first electrode.

3. The solar cell according to claim 1, wherein the solar cell includes a partition groove, wherein the partition groove extends through at least the transparent conducting layer, and the partition groove is positioned between the first electrode and the second electrode in the first direction.

4. The solar cell according to claim 3, wherein a position of the partition groove is one of the following three situations:
the partition groove is positioned on the first region,
the partition groove is positioned on the second region, and
the partition groove extends across a boundary between the first region and the second region.

5. The solar cell according to claim 1, further comprising:
a second tunneling layer, located on a surface of the first doped layer away from the first tunneling layer and located between the first doped layer and the polysilicon layer.

6. The solar cell according to claim 5, wherein a region of the polysilicon layer adjacent to the second tunneling layer is a lightly doped region, wherein the lightly doped region and the first doped layer have a same doping type.

7. The solar cell according to claim 6, wherein a doping concentration in the doped region in the polysilicon layer decreases along a direction from the first tunneling layer toward the first passivation layer until the doping concentration is zero.

8. The solar cell according to claim 1, wherein the first doped layer comprises a doping element comprising at least one element of oxygen, carbon, or nitrogen.

9. The solar cell according to claim 1, wherein the second doped layer comprises a doping element comprising at least one element of oxygen, carbon, or nitrogen.

10. The solar cell according to claim 1, further comprising:
a first diffusion layer, located on the first region of the first surface and located between the substrate and the first tunneling layer.

11. The solar cell according to claim 10, wherein the first diffusion layer comprises a crystalline silicon base, wherein doping elements in the crystalline silicon base have the same doping conductivity type as doping elements in the first doped layer, and a doping concentration of the doping elements in the crystalline silicon base is less than or equal to a doping concentration of the doping elements in the first doped layer.

12. The solar cell according to claim 1, further comprising:
an insulating layer, located on a surface of the polysilicon layer away from the passivating contact layer and located between the polysilicon layer and the first passivation layer.

13. The solar cell according to claim 1, wherein the polysilicon layer comprises a doping element comprising at least one element of oxygen, carbon, or nitrogen.

14. The solar cell according to claim 1, wherein the polysilicon layer has a thickness ranging from 3 to 150 nanometers.

15. The solar cell according to claim 10, further comprising:
a second diffusion region located on the second surface of the substrate, wherein the second diffusion region comprises a crystalline silicon base.

16. The solar cell according to claim 15, wherein a doping concentration of the second diffusion region is greater than a doping concentration of doping elements in the substrate.

17. The solar cell according to claim 1, further comprising:
a passivation and anti-reflection layer located on the second surface of the substrate.

18. The solar cell according to claim 17, wherein the passivation and anti-reflection layer comprises a second passivation layer stacked on the second surface of the substrate, or comprises a second passivation layer and an anti-reflection layer stacked on the second surface of the substrate; wherein
the second passivation layer is made of a material comprising intrinsic amorphous silicon, doped amorphous silicon, silicon oxide, or aluminum oxide;
the anti-reflection layer is made of a material comprising at least one of silicon nitride and silicon oxynitride.

19. The solar cell according to claim 1, wherein the first passivation layer is made of a material comprising intrinsic amorphous silicon, or the first passivation layer is made of a material doped with at least one element of oxygen, carbon, or nitrogen.

20. A photovoltaic module, comprising at least one cell group, wherein the cell group comprises at least two solar cells according to claim 1.

21. A photovoltaic system comprising the photovoltaic module according to claim 20.

* * * * *